US006592824B2

(12) United States Patent
Delucas et al.

(10) Patent No.: US 6,592,824 B2
(45) Date of Patent: Jul. 15, 2003

(54) HIGH DENSITY PROTEIN CRYSTAL GROWTH

(75) Inventors: Lawrence Delucas, Birmingham, AL (US); Robyn Rouleau, Birmingham, AL (US); Kenneth Banasiewicz, Helena, AL (US)

(73) Assignee: UAB Research Foundation, Birmingham, AL (US)

( * ) Notice: Subject to any disclaimer, the term of this patent is extended or adjusted under 35 U.S.C. 154(b) by 0 days.

(21) Appl. No.: 09/967,405

(22) Filed: Sep. 27, 2001

(65) Prior Publication Data

US 2002/0122760 A1 Sep. 5, 2002

Related U.S. Application Data

(62) Division of application No. 09/371,192, filed on Aug. 10, 1999, now Pat. No. 6,447,226.
(60) Provisional application No. 60/095,984, filed on Aug. 10, 1998, and provisional application No. 60/139,551, filed on Jun. 16, 1999.

(51) Int. Cl.[7] .............................................. C03B 35/00
(52) U.S. Cl. ........................ 422/99; 117/200; 117/202; 117/206; 422/245.1
(58) Field of Search ........................ 422/99, 100, 245.1, 422/253; 117/200, 201, 202, 206, 207, 901; 23/295 R

(56) References Cited

U.S. PATENT DOCUMENTS

| 4,517,048 | A | | 5/1985 | Shlichta |
| 4,917,707 | A | | 4/1990 | Claramonte et al. |
| 4,919,900 | A | | 4/1990 | Martin et al. |
| 4,964,596 | A | | 10/1990 | Ganssle et al. |
| 5,013,531 | A | | 5/1991 | Snyder et al. |
| 5,078,975 | A | | 1/1992 | Rhodes et al. |
| 5,106,592 | A | | 4/1992 | Stapelmann et al. ..... 422/245.1 |
| 5,266,284 | A | | 11/1993 | Heilig et al. |
| 5,531,185 | A | * | 7/1996 | Asano et al. ............... 117/206 |
| 5,643,540 | A | | 7/1997 | Carter et al. |
| 5,961,934 | A | | 10/1999 | Arnowitz et al. ......... 422/245.1 |
| 6,027,565 | A | * | 2/2000 | Bugg et al. ................. 117/202 |

* cited by examiner

Primary Examiner—Joseph Drodge
(74) Attorney, Agent, or Firm—Merchant & Gould P.C.

(57) ABSTRACT

A protein crystal growth assembly including a crystal growth cell and further including a cell body having a top side and a bottom side and a first aperture defined therethrough, the cell body having opposing first and second sides and a second aperture defined therethrough. A cell barrel is disposed within the cell body, the cell barrel defining a cavity alignable with the first aperture of the cell body, the cell barrel being rotatable within the second aperture. A reservoir is coupled to the bottom side of the cell body and a cap having a top side is disposed on the top side of the cell body.

21 Claims, 43 Drawing Sheets

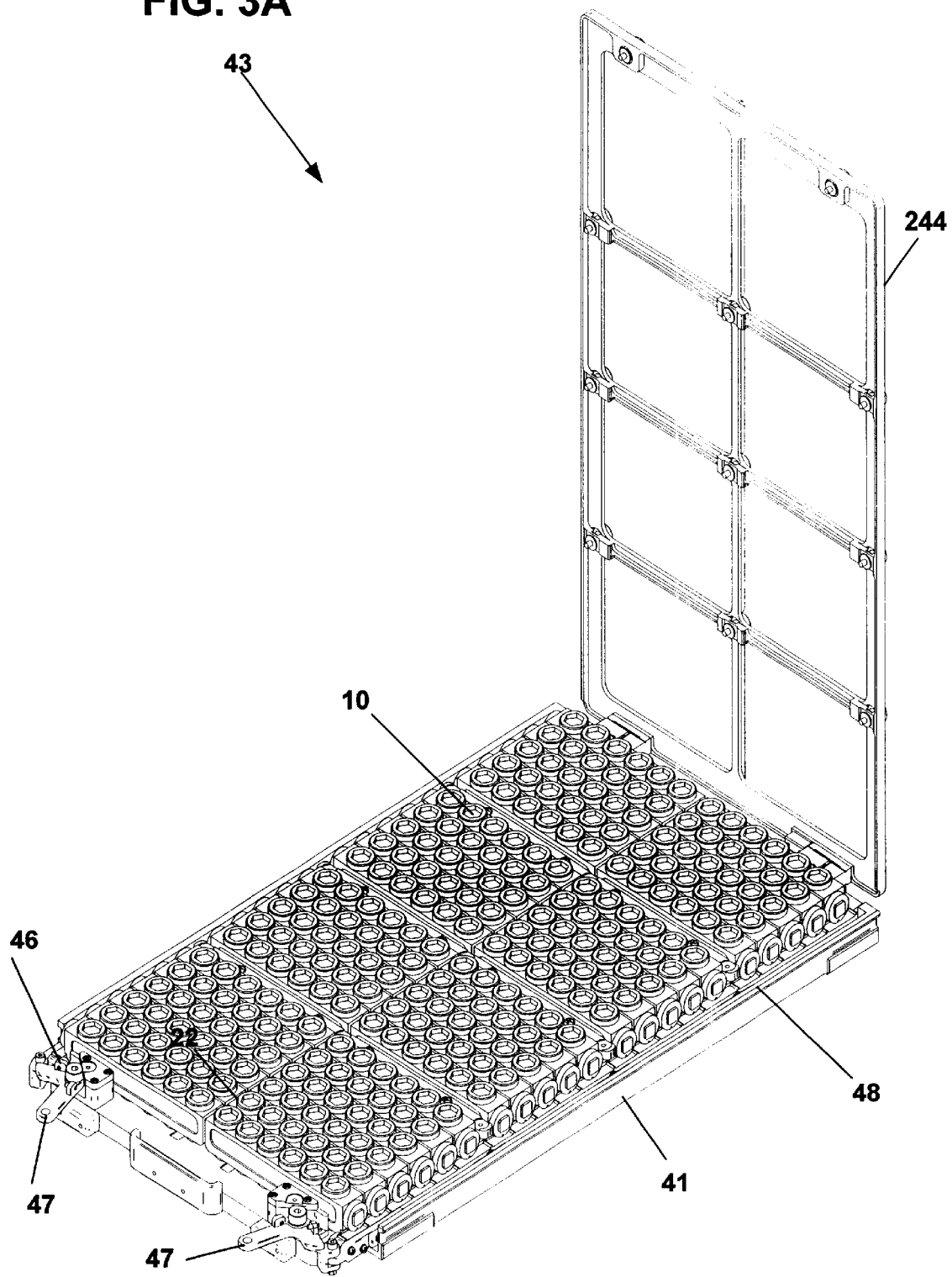

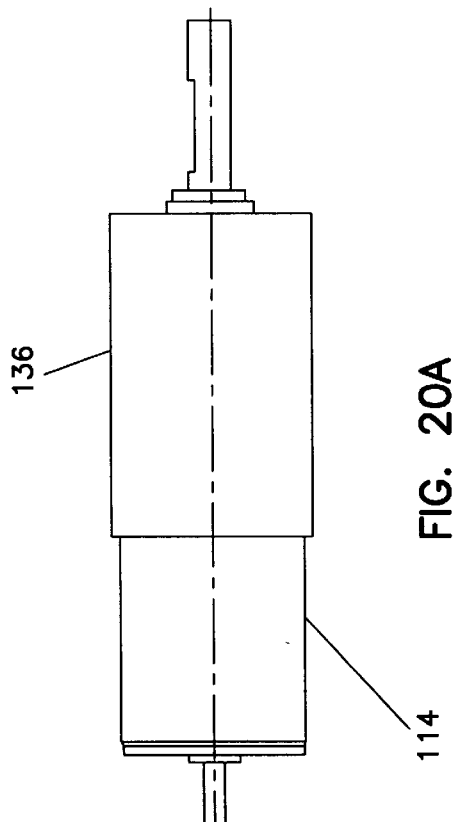
FIG. 20A
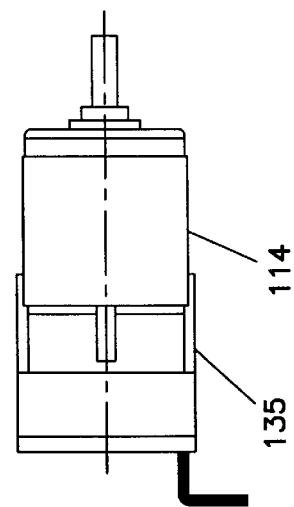
FIG. 20B
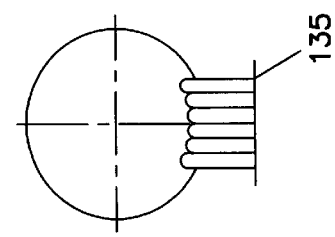

HIGH DENSITY PROTEIN CRYSTAL GROWTH

"This application is a divisional of application Ser. No. 09/371,192, filed Aug. 10, 1999, now U.S. Pat. No. 6,447, 226, which application is incorporated herein by reference."

This application claims the benefit of U.S. Provisional Application No. 60/095,984, filed Aug. 10, 1998, and U.S. Provisional Application No. 60/139,551, filed Jun. 16, 1999.

BACKGROUND

1. Field of the Invention

The present invention relates to an apparatus and method for conducting experiments for growing a large number of protein crystals.

2. Description of Related Art

Due to advances in the protein crystal growth (PCG) field, it has become apparent that current experiment configurations no longer fully utilize the available experiment volume of space shuttle orbiter flight incubators. Additionally, conventional experimental hardware is not conducive to the long duration micro-gravity flights available aboard the International Space Station (ISS). In addition, conventional systems cannot freely utilize the limited space, power requirements and down-link flight telemetry systems available aboard the International Space Station or Space Shuttle Orbitor.

It can be seen that there is a need for a method and apparatus for protein crystal growth that can fully utilize the confined experiment volume available on space shuttle orbitors and space stations.

It can also be seen that there is a need for experimental hardware that is conducive to long duration micro-gravity flights aboard the International Space Station.

It can also be seen that there is a need to more freely utilize the limited space, power requirements and down-link flight telemetry systems available aboard the International Space Station or Space Shuttle Orbitor.

SUMMARY OF THE INVENTION

To overcome the limitations of the related art described above, and to overcome other limitations that will become apparent upon reading and understanding the present specification, the present invention relates to an apparatus, system and method for conducting experiments for growing a large number of protein crystals designed to fit in a single locker space incubator.

One aspect of the invention provides a protein crystal growth assembly. The protein crystal growth assembly includes a crystal growth cell. The crystal Growth cell further includes a cell body having a top side and a bottom side and a first aperture defined therethrough, the cell body having opposing first and second sides and a second aperture defined therethrough. A cell barrel is disposed within the cell body, the cell barrel defining a cavity alignable with the first aperture of the cell body, the cell barrel being rotatable within the second aperture. A reservoir is coupled to the bottom side of the cell body and a cap having a top side is disposed on the top side of the cell body.

Another aspect of the invention provides a protein crystal growth tray assembly. The protein crystal growth tray assembly includes a tray adapted to hold a protein crystal growth assembly; a securing mechanism holding the protein crystal growth assembly in place in the tray; an engaging mechanism provided on the tray, the engaging mechanism coupled with the protein crystal growth assembly; and a pivot assembly coupled to the engaging mechanism for moving the protein crystal growth assembly between two positions by operation of the pivot assembly.

A further aspect of invention provides a protein crystal growth incubator assembly. The protein crystal growth incubator assembly includes a housing having interior and exterior sides defining an internal storage compartment; and a stacked protein crystal growth tray configuration slideable into and out of the internal storage compartment, the stacked protein crystal growth tray configuration holding one or more protein crystal growth tray assemblies.

Yet another aspect of the invention provides a protein crystal growth command and monitoring system. The protein crystal growth command and monitoring system includes a chassis having interior and exterior sides, the chassis housing a video monitoring and translation mechanism; a protein crystal growth tray assembly having protein crystal growth assemblies disposed therein, the tray assembly arranged within the interior side of the chassis for video monitoring of the protein crystal growth cells; a video camera assembly for monitoring the protein crystal growth assemblies; a translation mechanism arranged on the chassis and coupled to the video camera assembly for positioning the video camera assembly above the protein crystal tray assembly; and a controller providing control signals to the translation mechanism for controlling the translation and positioning of the video camera.

Still another aspect of the invention provides, in a protein crystal growth assembly including a cell body having a top side and a bottom side and a first aperture defined therethrough, the cell body having opposed first and second sides and a second aperture defined therethrough; a cell barrel disposed within the cell body, the cell barrel defining a cavity alignable with the first aperture of the cell body; a reservoir coupled to the bottom side of the cell body, the cell barrel being rotatable within the second aperture; a protein cell insert disposed within the cavity of the cell barrel, the protein cell insert having an inner portion and an outer portion wherein the inner portion defines a well; and a cap having a top side disposed on the top side of the cell body. Another aspect of the invention further includes a method of growing protein crystals. The method includes rotating the cell barrel, to orient the growth cell in a fill/removal position; loading a premixed protein in the protein cell insert of a growth cell assembly; securing the premixed protein in the protein insert; rotating the cell barrel to a launch configuration position; at a predetermined time, rotating the cell barrel to a position to activate an experiment by placing the growth cell in a growth position; and at a second predetermined time, rotating the cell barrel to a position to deactivate the experiment by placing the growth cell in the fill/removal position.

These and various other features of novelty as well as advantages which characterize the invention are pointed out with particularity in the claims annexed hereto and form a part hereof. However, for a better understanding of the invention reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout, where:

FIGS. 3A–C illustrate examples of various embodiments of a single high Density protein crystal growth (HDPCG) tray assembly;

FIGS. 20A–B illustrate examples embodiments of a stepper motor and encoder;

DETAILED DESCRIPTION OF THE PREFERRED EMBODIMENT

Figure 1:
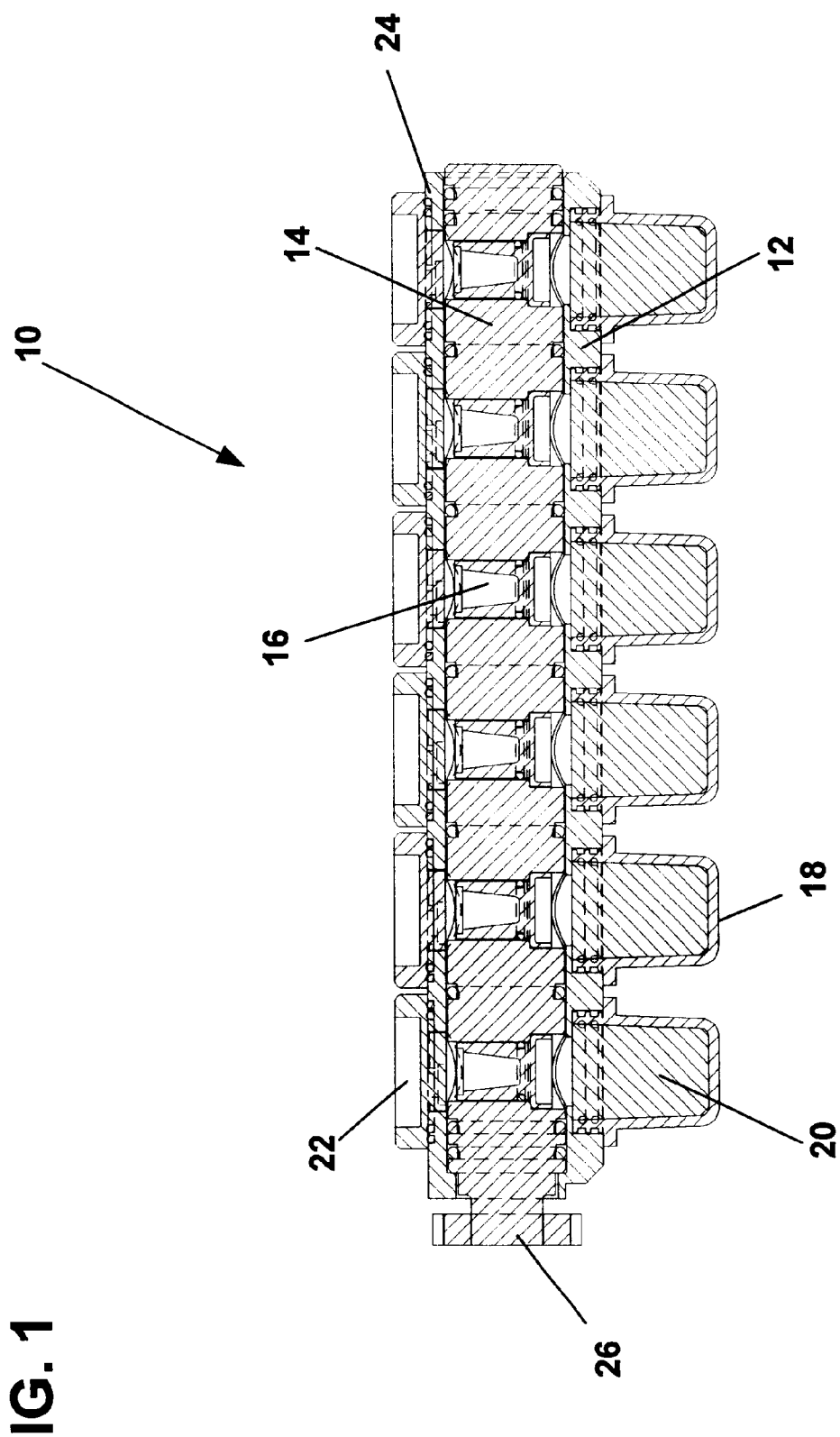
FIG. 1 illustrates an example of one embodiment of a protein crystal growth cell assembly.

In the following description of the specific embodiments, reference is made to the accompanying drawings which form a part hereof, and in which is shown by way of illustration the specific embodiments in which the invention may be practiced. It is to be understood that other embodiments may be utilized as changes may be made without departing from the spirit and scope of the present invention.

In one embodiment the present invention provides a Commercial Refrigerator Incubator Module-Modified (CRIM-M) for utilization in early flights of the Space Shuttle Orbitor.

In one embodiment the present invention provides a Commercial Refrigerator Incubator Module-Modified (CRIM-M) for utilization in early flights of the Space Shuttle Orbitor providing an internal storage compartment having a width of about 10 inches, a height of about 7 inches and a depth of about 17 inches for storing a stacked protein crystal growth tray configuration according to the present invention.

In another embodiment the present invention provides a next generation thermal carrier (NGTC), to be utilized when mid-deck modifications to the Space Shuttle Orbitor are completed. The high density protein crystal growth system (HDPCG) and video command and monitoring system (VCMS) of this embodiment are designed to complement each other. The experiment configurations for the HDPCG/VCMS will be compatible with the planned EXPRESS Rack available accommodations. Finally, the HDPCG growth samples will be easily accessible to crew members for harvesting, frozen storage, or other accommodations.

In yet another embodiment, the present invention provides a new generation of PCG hardware in order to freely utilize the limited space, power requirements, down-link flight telemetry data, and other early ISS limitations. Growth chambers, in this embodiment will include additional design considerations such as: (1) fit inside the Next Generation Thermal Carrier; (2) hold a large quantity of samples; (3) allow vapor diffusion, batch, & liquid to liquid (L/L) crystal growth methods together in one incubator; (4) make it easy to harvest crystals while in orbit; (5) provide video images of samples; (6) be automated from Earth based stations; (7) utilize conventional materials; (8) hold 10–50 micro-liter samples minimum; and (9) be accessible enough to cryogenically preserve the crystals while in orbit.

Other embodiments include easy transfer to a X-ray crystallography facility (XCF) Crystal Preparation Prime Item (CPPI) and sample volumes consistent with previous vapor diffusion apparatus (VDA) type experiments.

Although crystal adhesion to the sides of a well defined by an interior portion of a protein cell insert may present problems, one solution is to possibly coat the walls defining the well with an oil such as an immersion oil, for example, that may be used to reduce the chance of crystal adhesion to the side walls of the protein well if necessary.

The following is a list of some of the distinct aspects of the present invention, whereby:

1. Crystals may be viewed through an optically clear access cap without having to open the sealed container and exposing the fragile crystals to the ambient environment;
2. Up to 1008 cells may be accessed individually without risking harm to other cells in the immediate area;
3. Each individual cell is isolated from the environment by double "O-ring" containment to ensure sealing during in-orbit operations;
4. Individual protein inserts used in the cell barrel of the protein crystal growth assembly are designed to hold volumes consistent with ground based experiments;
5. The protein inserts may be made of molded LEXAN and can be modified individually to hold volumes ranging from 10 micro-liters ($\mu l$) to 40 micro-liters ($\mu l$);
6. The protein inserts are designed to facilitate easy harvesting by having a high surface finish wall and a 6 degree taper;
7. The protein inserts have a sharp pinning angle at the top to keep the protein solution from "creeping" up the sides in a micro-gravity environment;
8. The cell barrel used in the protein crystal growth assembly is designed to rotate in up to four different orientations. There are two launch configuration positions (depending on whether the Incubator is located in the Space Shuttle): a loading/harvesting position, and a growth position;
9. The cell barrel can be rotated in an orientation whereby the Space Shuttle launch "G-force" keeps the protein solution in the Protein Insert and will not let it "creep" out during the ascent;
10. The cell barrel can be rotated in an orientation that will be conducive to accomodating Space Shuttle landing loads, thus assuring that during the occasional "hard landing" the protein crystals and solution will stay intact;
11. The PPT reservoir used in the protein crystal growth assembly is designed to use a Chromex Barrier, which keeps the ½ milliliter reservoir solution from "creeping out" during Space Shuttle Launch and while in a micro-gravity environment;
12. growth cell blocks can be activated in smaller groups, e.g. groups of 21, instead of all at once. This is helpful if proteins have different growing cycles during a given mission;
13. The individual growth cell blocks can be removed from the sample tray very easily without disturbing the others. This is beneficial prior to the Space Shuttle Launch when a "Launch Scrub" requires only certain proteins to be reloaded;
14. The experimental apparatus can operate properly under one G-force; and
15. The experimental apparatus can operate during International Space Station operations, Space Shuttle operations, and other micro-gravity operations.

High Density Protein Crystal Growth (HDPCG) System Description

The HDPCG system is the first phase of a 3 phase program for commercial protein crystal growth (CPCG). This system will utilize the apparatus for the protein crystal growth mechanism for the program. The second phase comprises the HDPCG and the VCMS system. This system will be used to help evaluate protein crystal size, location and potential for X-ray data collection. The third phase of the program will be an X-ray crystallography facility (XCF). This XCF system will collect X-ray data sets on the protein samples grown in the HDPCG apparatus, which will be assessed and selected utilizing the VCMS system.

The HDPCG Experiment Assembly includes, for example, 1008 individual growth cells stored within sample trays. This apparatus is then placed into a thermal control facility in order to maintain the temperatures required by the experiment. The first generation HDPCG experiment assembly will utilize vapor diffusion as the process for protein crystal growth, with other methods of crystal growth to follow.

Figure 2B:
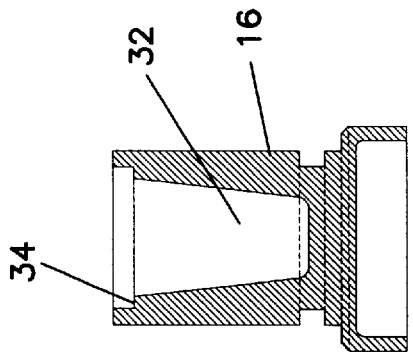
FIGS. 2A–D illustrate examples of various views and components of one embodiment of a protein crystal growth cell assembly.

Turning now to FIG. 1, one embodiment of a protein crystal growth cell assembly 10 comprises a cell body 12, cell barrel 14, protein inserts 16, PPT Reservoirs 18, chromex barriers 20, hex head access caps 22, O-rings 24 and a Spur Gear 26. The cell body 12 and cell barrel 14 are machined from clear Polysulfone P1700. A molded LEXAN version could be used to reduce cost and allow the experimenter the ability to keep the hardware after each mission. The cell barrel 14 is designed to rotate within the cell body 12 in order to activate/deactivate the experiment and to seal the protein within the assembly when in launch configuration 28. As shown in FIG. 2A, this may accomplished by using the spur gear 26, that may be manufactured from a synthetic resin such as Delrin, for example. During launch, the growth cell assembly 10 may experience a G-Force as indicated by G-Force vector 30. The spur gear 26 is located on one end of the growth cell assembly 10 and it is designed to interface with a 26 gear 48 (FIG. 3A, for example a tooth pitch gear) on a sample tray assembly 43 (FIG. 3A), so that the samples can be activated, or deactivated simultaneously.

Located within the cell barrel 14 are six protein inserts 16 where premixed proteins are loaded. As illustrated in FIG. 2B the Protein Insert 16 has a tapered well 32 and a 90° pinning angle 34 to restrict the protein drops from wicking out of the well while in a micro-gravity environment. Different size options can be provided to the experimenter, for example a 40 $\mu l$ and a 20 $\mu l$ version.

Figure 2D:
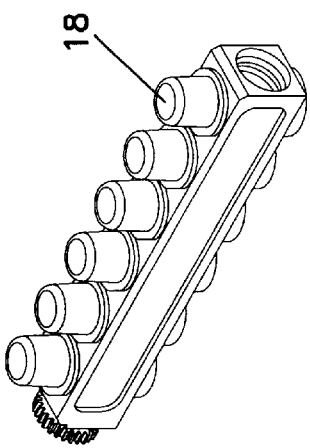
Figure 2A:
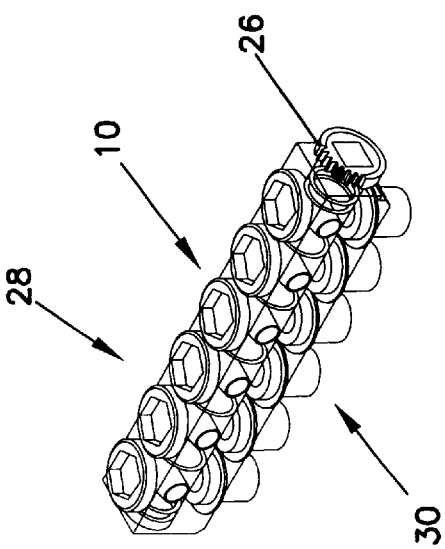
Figure 2C:
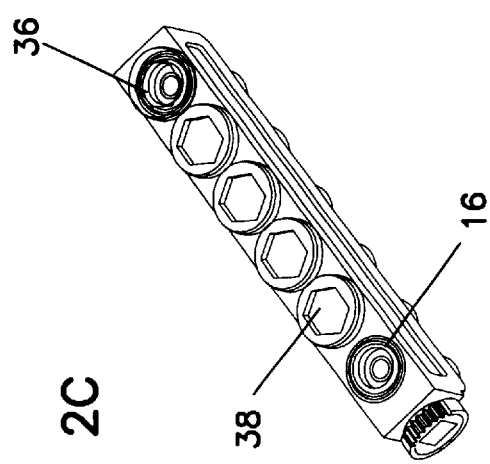

Illustrated in FIG. 2C is one embodiment of a hex head access cap 38 that is used to seal the protein environment from the outside. The hex head access caps 38 can be designed for cooperation with the XCF crystal preparation prime item (CPPI) robotics for remote access. Also included are double O-ring containment 36 to prevent leakage of the protein solution during the experiment. The protein inserts 16 and hex head access caps 38 can be made of optical grade LEXAN. This allows a level of clarity as needed for the VCMS during the second phase of the commercial protein crystal growth (CPCG) HDPCG program.

FIG. 2D illustrates embodiments of six PPT reservoirs 18 located on the cell body 12. The PPT reservoirs 18 can be made from molded clear Polysulfone P1700. Each PPT reservoir 18 houses a chromex barrier 20 in order to contain the protein precipitant and is designed to provide easy access. Once the premixed proteins are loaded and secured, the cell barrel 14 is turned 90° for launch configuration 28.

FIG. 3A illustrates one embodiment of a HDPCG sample tray assembly 43 with a hinged lid 244 in the open position. A HDPCG experiment assembly is capable of housing several, for example up to four, sample tray assemblies 43 at a time. The sample tray assemblies 43 are designed to secure the growth cell assemblies 10 during an experiment. Each sample tray assembly 43 may have a hinged lid 244, which is used to lock the growth cell assemblies 10 into place and thus allows for the ease of loading and unloading samples.

Each sample tray assembly 43 is capable of securing 42 growth cell assemblies 10 (21 on each side). All 21 growth cell assemblies 10 on each side are activated/deactivated together by the push/pull movement of the geared rack 46 and 26 gear 48 that engages each individual spur gear 26 of the growth cell assemblies 10. The growth cell assemblies 10 rest in tray 41. This allows the total number of samples to be as much as 252 per tray 43 (for a total of 1008 on four trays) for the apparatus where previous University of Alabama at Birmingham (UAB) crystal growth experiments were limited to approximately 128. Pivot assembly 47 activates 21 growth cell assemblies per side. There are two pivot assemblies 47 per sample tray 43.

Figure 3B:
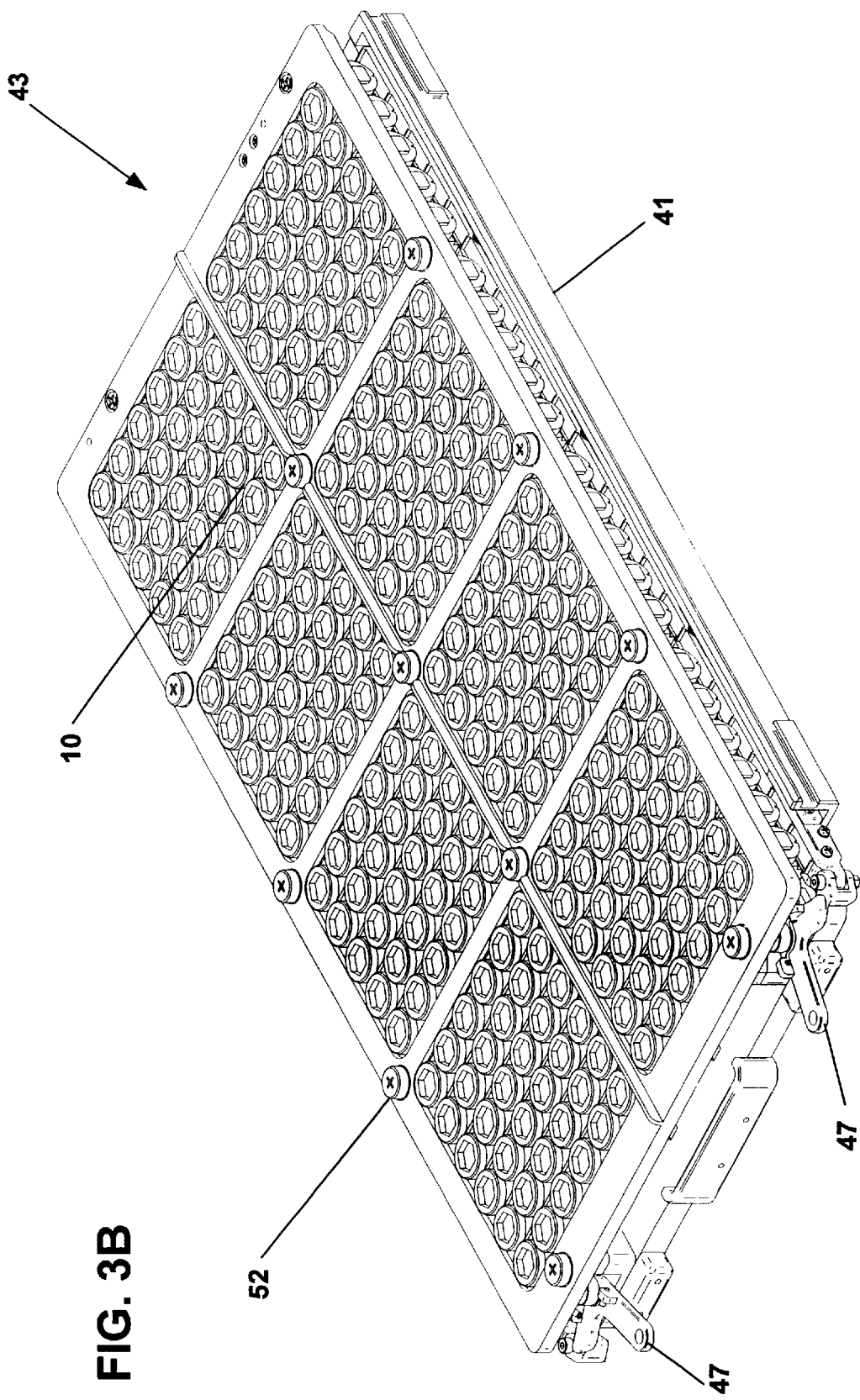
Figure 4A:
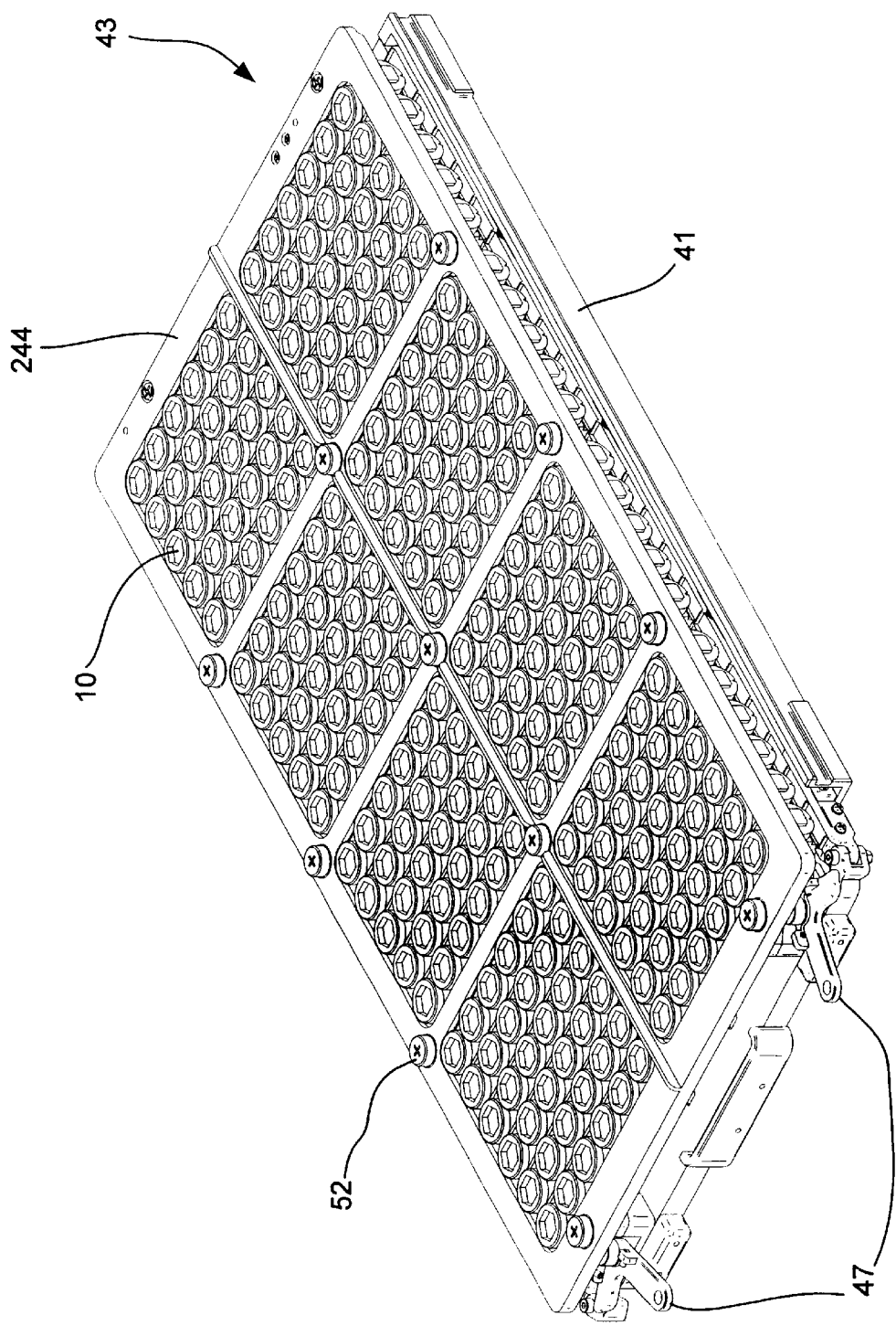
FIGS. 4A–D illustrate examples of various embodiments of a single HDPCG sample tray and stacked tray configurations.

FIGS. 3B and 4A illustrate one embodiment of a HDPCG Sample Tray Assembly 43 with a lid 244 in a closed position. The sample tray assembly 43 further includes captive screws 52 to secure the trays. There are 42 growth cell assemblies 10 per tray 41 at a weight of about 3.7 lbs. per tray with the weight of the tray 41 being about 1.8 lbs. The lid assembly 244 weighs about 0.57 lbs.

Figure 3C:
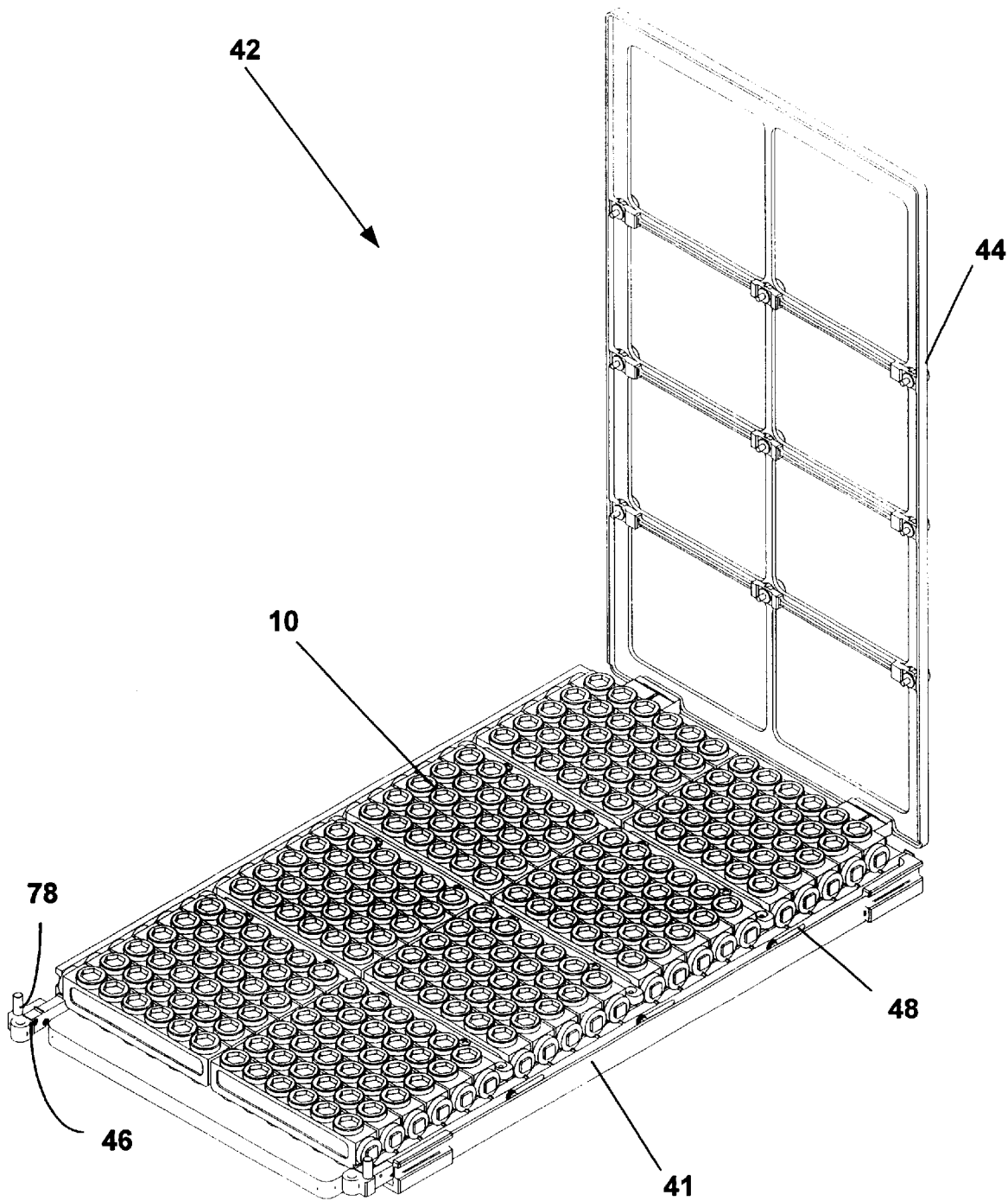

FIG. 3C illustrates another embodiment of a HDPCG sample tray assembly 42 with a hinged lid 44 in the open position. The HDPCG Experiment Assembly is capable of housing several, for example up to four, sample tray assemblies 42 at a time. The sample tray assemblies 42 are designed to secure the growth cell assemblies 10 during an experiment. Each sample tray assembly 42 has a hinged lid 44, which is used to lock the growth cell assemblies 10 into place and thus allows for the ease of loading and unloading samples.

Figure 4B:
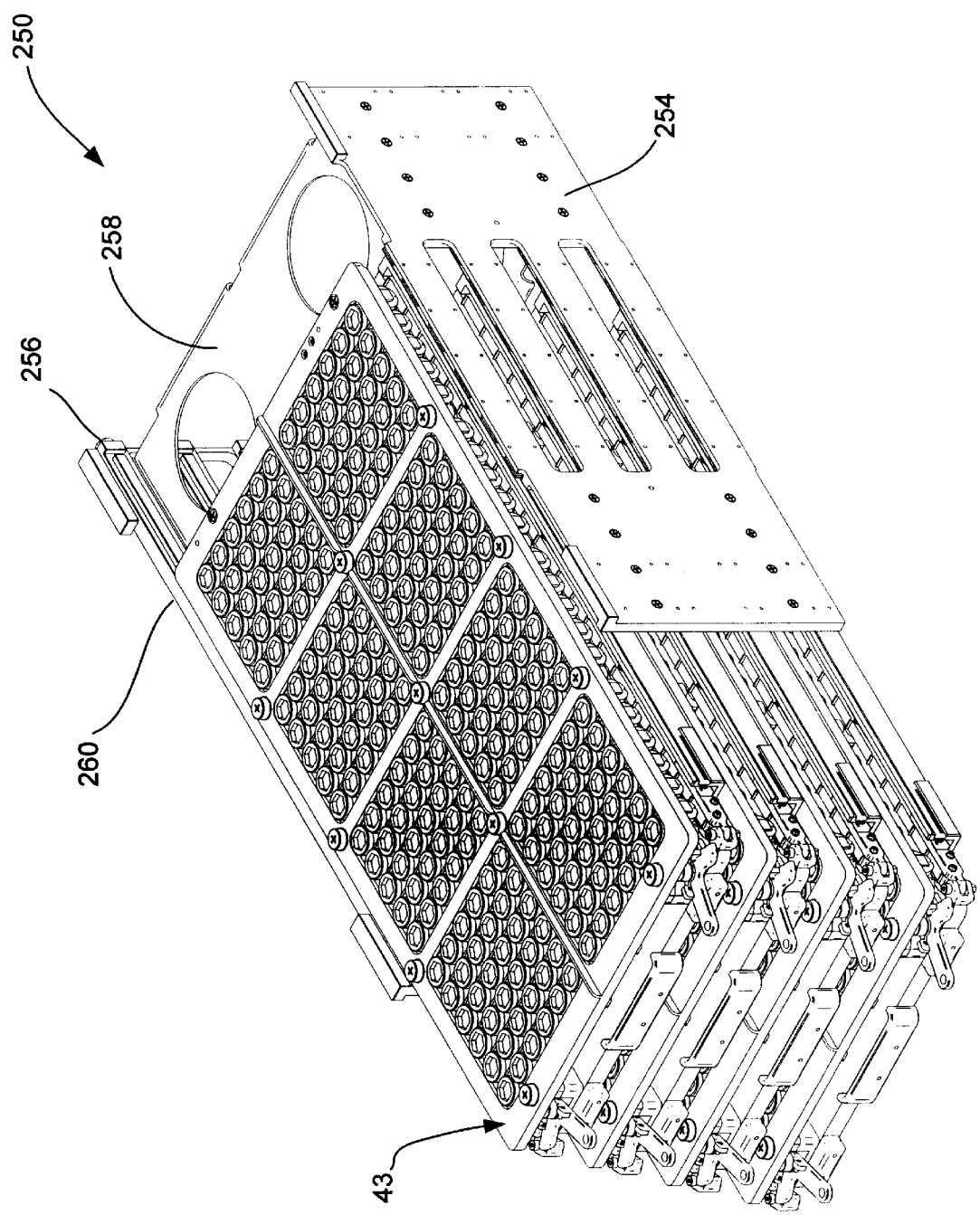

FIG. 4A is another view of one embodiment of a sample tray assembly 43 with its hinged lid 244 in a closed position. As illustrated in FIG. 4B one embodiment of a sample tray assembly 43 may be arranged in a stacked tray assembly configuration 250 designed to slide in and out of a protein crystal growth incubator assembly such as a Commercial Refrigeration Incubator Module-Modified 63 (CRIM-M) (FIG. 5). For easy access slides (for example of Delrin) are provided on either side of the inside portion of the CRIM-M, thus permitting removal of the sample tray assemblies 43 individually, for example for future transfer to the VCMS. The stacked tray configuration 250 further includes a hot side wall 254, a rear stop 256, an internal structure assembly 258 and cold side wall 260.

In one specific example, there are four tray assemblies 43 in each CRIM-M 63 (FIG. 5) at 6.00 lbs. each for a total weight of 24.00 lbs. The internal structure assembly 258 weighs about 3.90 lbs. The total Experiment Weight is about 27.90 lbs.

Figure 4C:
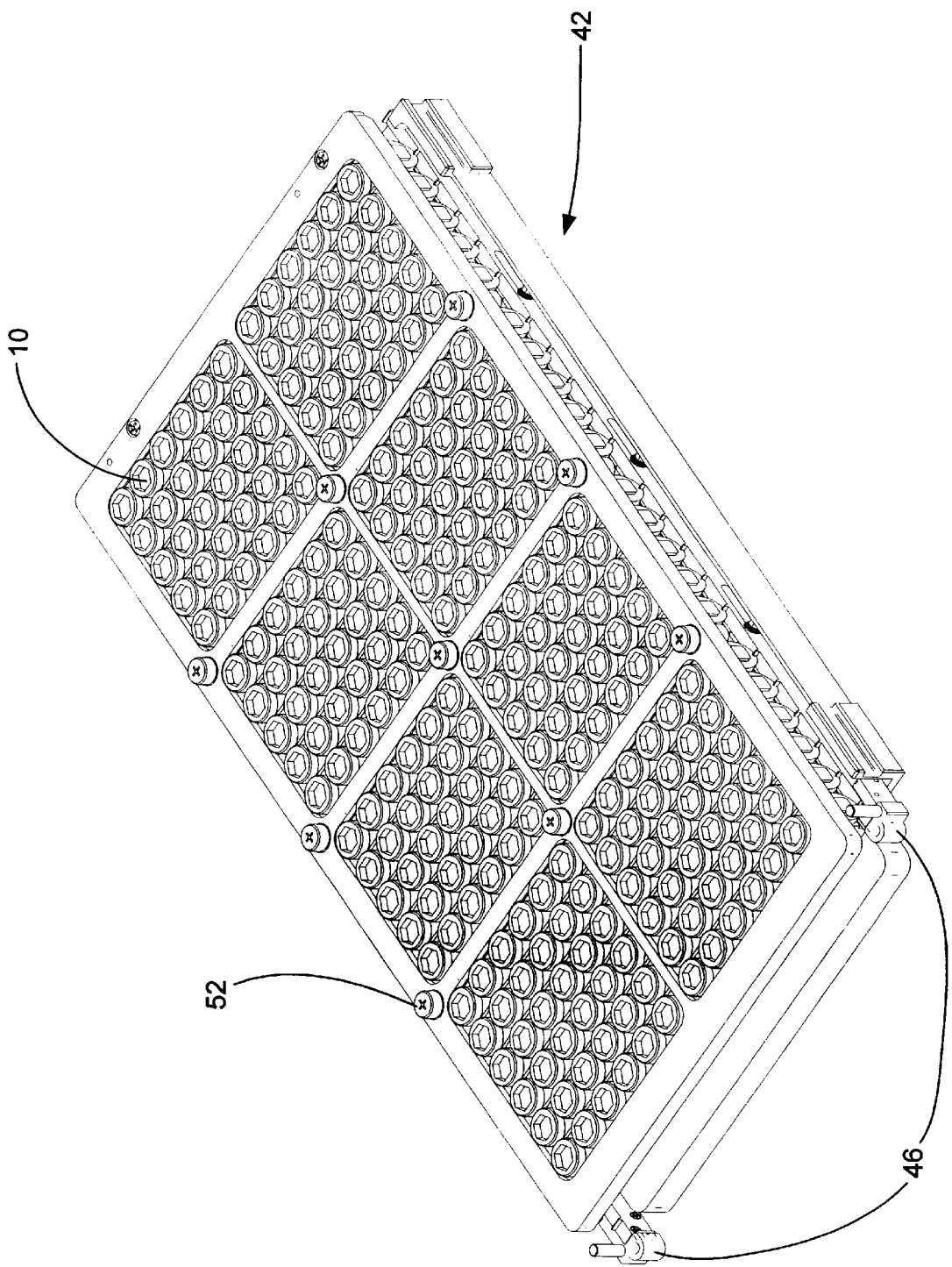
Figure 4D:
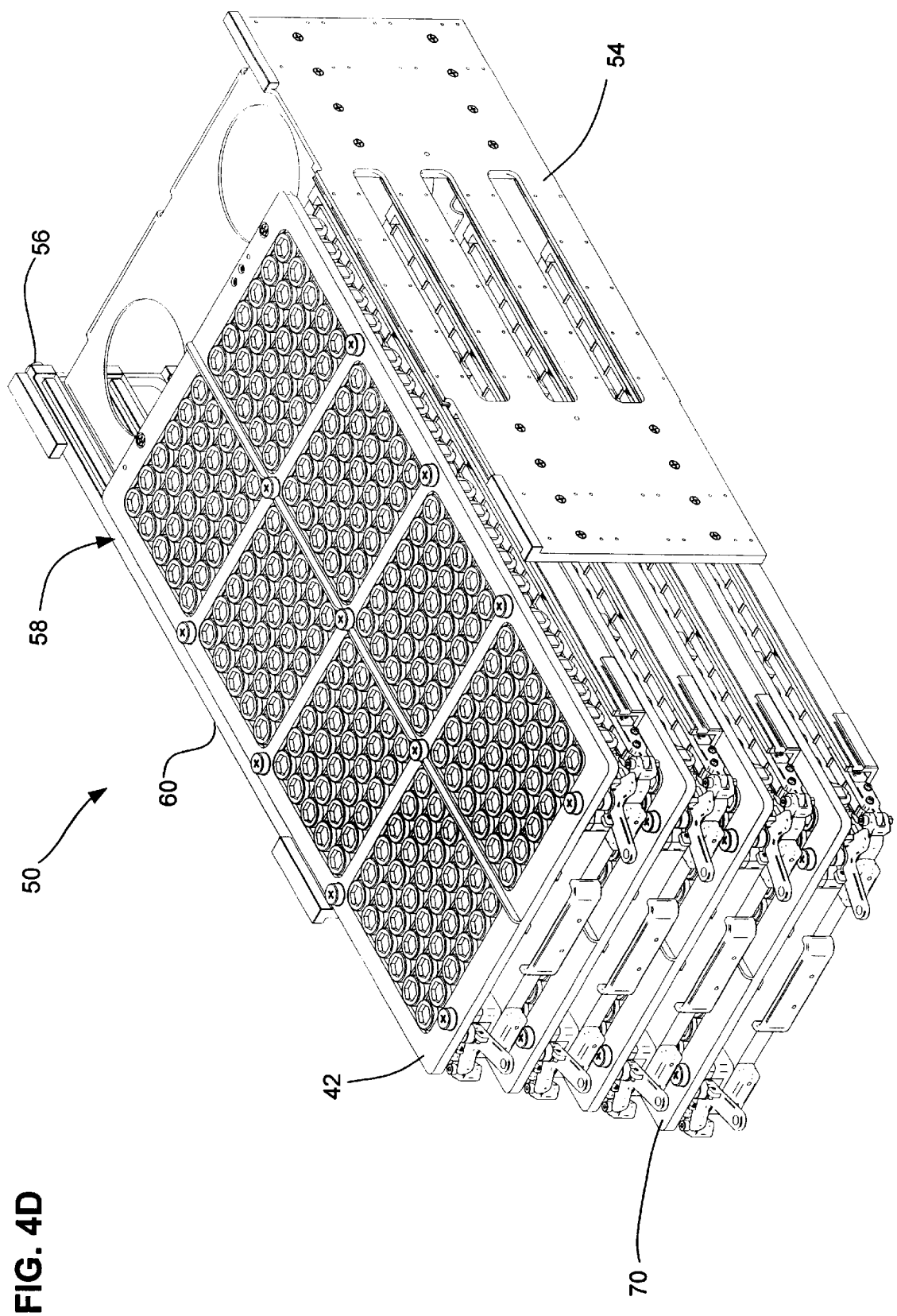

FIG. 4C is yet another view of one embodiment of a sample tray assembly 42 with its hinged lid 44 in a closed position. As illustrated in FIG. 4D one embodiment of a sample tray assembly 42 may be arranged in a stacked tray assembly configuration 50 designed to slide in and out of a Commercial Refrigeration Incubator Module-Modified 63 (CRIM-M) (FIG. 5). The stacked tray configuration 50 further includes a hot side wall 54, a rear stop 56, an internal structure assembly 58 and cold side wall 60.

Figure 5A:
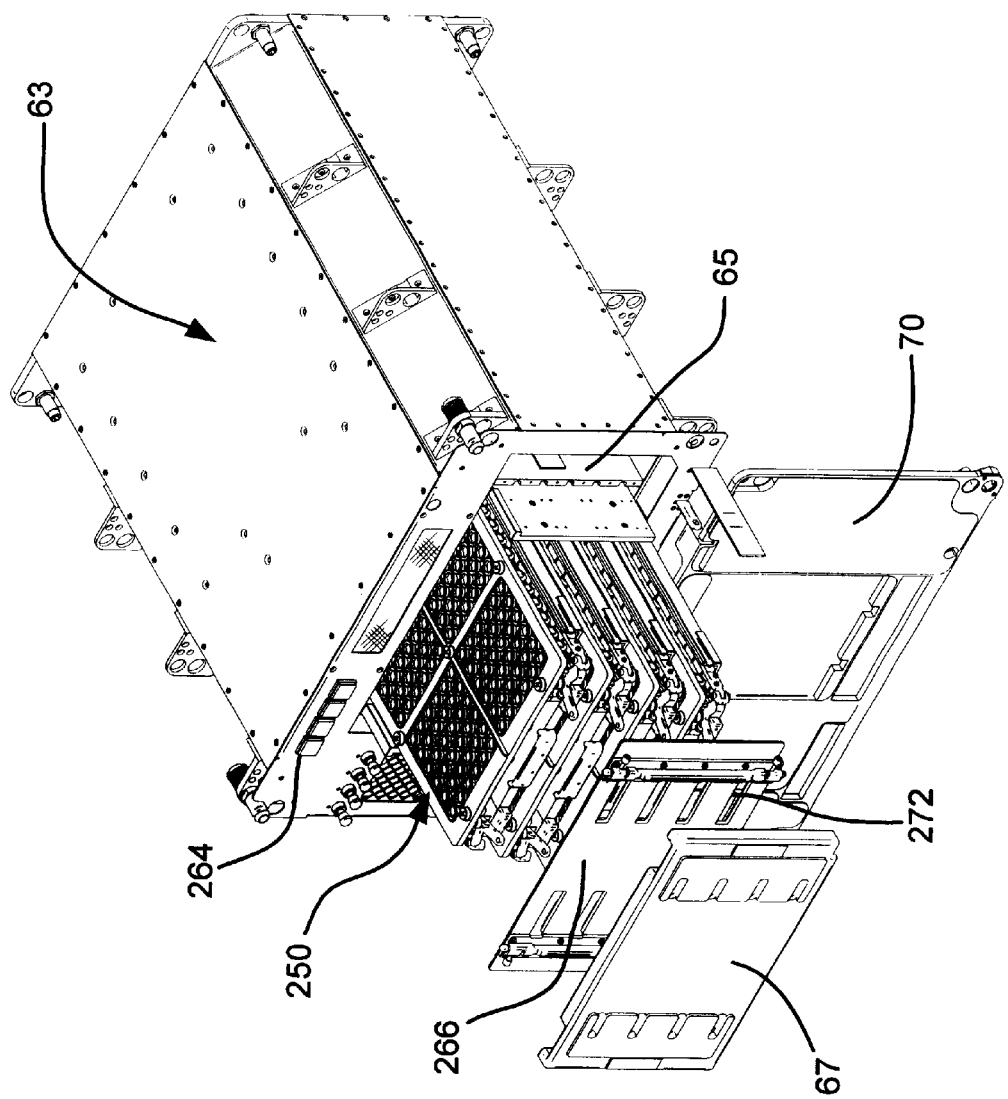
FIGS. 5A–B illustrate examples of embodiments of a HDPCG apparatus installed in a Commercial Refrigeration Incubator Module-Modified (CRIM-M)

Illustrated in FIG. 5A is one embodiment of a HDPCG stacked tray assembly Configuration 250 installed inside of a Commercial Refrigeration Incubator Module-Modified 63 (CRIM-M). The CRIM-M 63 is a single locker thermal control facility, similar to that used in early ISS Development. This apparatus fits into the CRIM-M 63 in a similar manner as previous crystal growth experiments, for example Vapor Diffusion Apparatus 2 (VDA-2), Commercial Vapor Diffusion Apparatus (CVDA) and Protein Crystallization Facility (PCF). The CRIM-M 63 provides a Crew Interface 264 required for setting the temperature profiles and monitoring the state of the system for the experiment. In addition, the CRIM-M 63 provides an internal storage compartment 65, a retainer door assembly 266, foam insulation 67 and door 70.

Figure 5B:
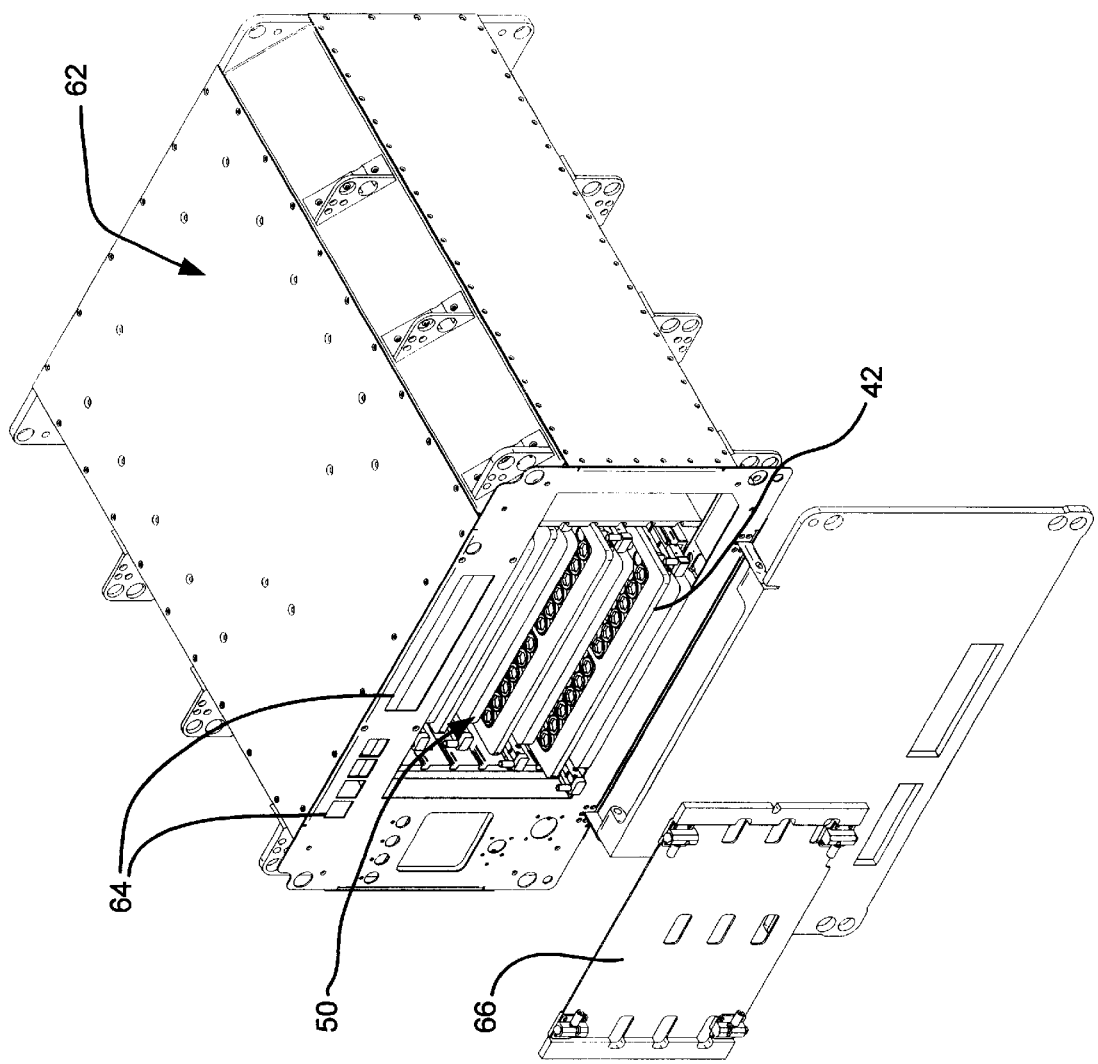

Illustrated in FIG. 5B is another embodiment of a HDPCG stacked tray assembly configuration 50 installed in a Commercial Refrigeration Incubator-Module 62 (C-RIM) 62. The CRIM 62 provides a crew interface 64 required for setting the temperature profiles and monitoring the state of the system for the experiment. In addition, the CRIM 62 provides a retainer door assembly 66.

Figure 6A:
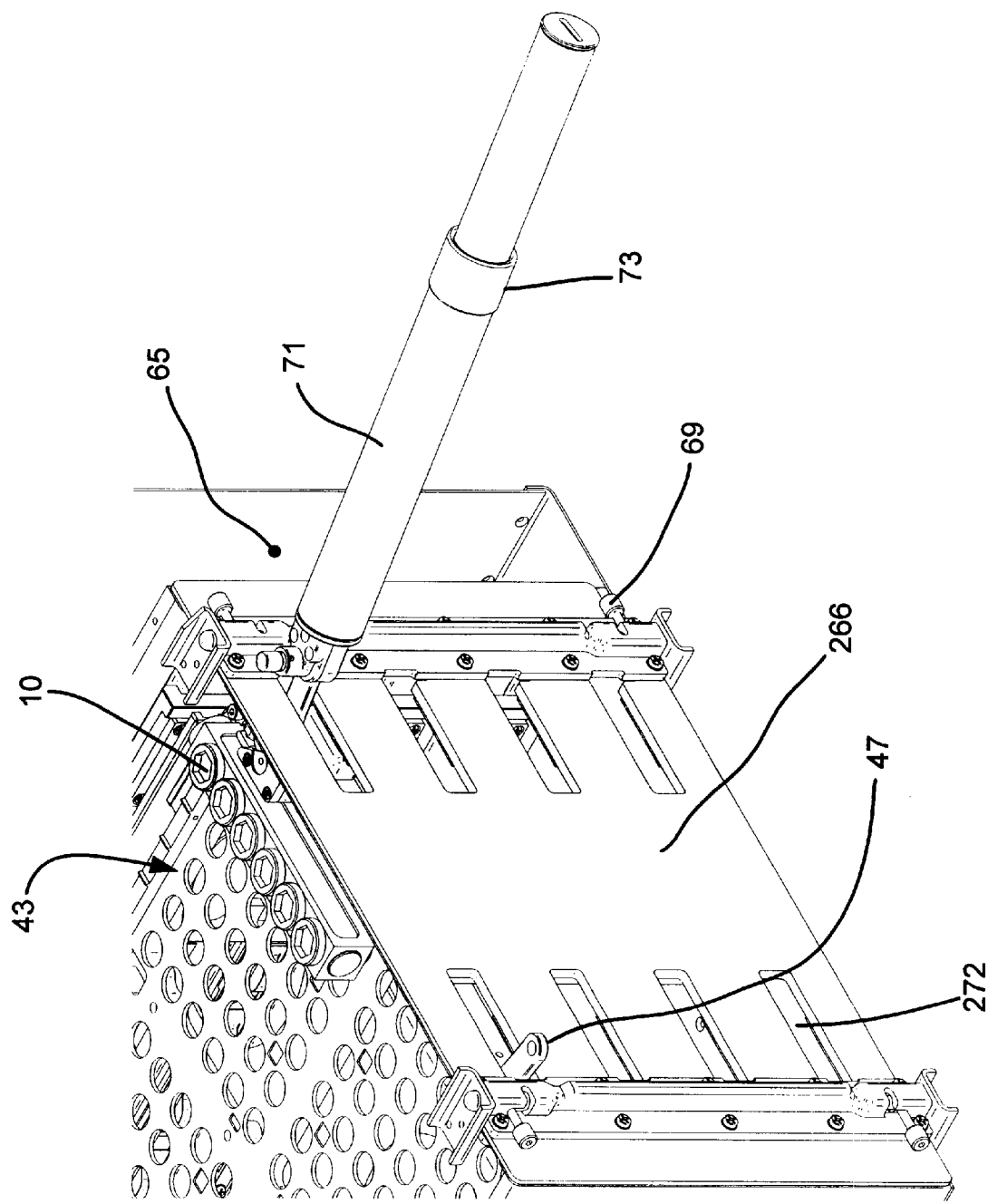
FIG. 6A illustrates one example of one embodiment of a method of activating/deactivating a tray and a commercial protein crystal growth (CPCG) actuator handle in its extended position engaging the pivot assembly of the tray.

As illustrated in FIG. 6A, one embodiment of a HDPCG experiment is easily activated, or deactivated by the use of the commercial protein crystal growth (CPCG) actuator handle 71. The actuator handle 71 is retrieved from the CRIM-M Internal Storage Compartment 65 where it is collapsed for storage. In order to activate/deactivate the experiment the CRIM-M door 70 (not shown) must be opened and the foam insulation 67 (not shown) temporarily removed. This allows the retainer door 266 to be visible. There are eight slots 272 that are located on the retainer door 266. Each slot 272 is labeled and contains a pivot 47 that extends through the slot so that the actuator handle 71 can be used to activate/deactivate the sample tray assembly 43. This allows for the ease and flexibility of activating/deactivating the sample tray assemblies 43 individually. For clarity only one growth cell assembly 10 is shown.

The actuator handle 71 is extended for leverage by loosening the locking ring 73. Once the actuator handle 71 is extended, the locking ring 73 is tightened. The actuator handle 71 is ready to engage and secure the pivot 47 by snapping the actuator's clevis around the pivot hole 272. Once the pivot 47 is secured by the actuator handle 71, it is then pushed to the left or right depending on the flight configuration. The actuator handle 71 is then removed by pulling the actuator handle 71 from the pivot 47. This has activated/deactivated one side of the sample tray assembly 43. The opposite side of the sample tray 43 is activated/deactivated in the same manner and this sequence is repeated for the remaining three trays. Also shown is a latch assembly 69.

Once all of the sample tray assemblies 43 have been activated/deactivated, the locking ring 73 on the actuator handle 71 is loosened and pushed into the original position. The locking ring 73 is tightened to secure the handle 71. The actuator handle 71 then is placed back into the CRIM-M Internal Storage compartment 65. The experiment is activated/deactivated once all four trays have been activated/deactivated. For reference, in one specific example, 50° of rotation on the pivot assembly 47 will correspond to 0.851" of rack 46 linear translation and 180° of rotation on the cell barrel 14 inside the growth cell assembly 10.

The CPCG-HDPCG experiment assembly includes the CRIM-M 63 and the installed stacked HDPCG tray assembly configuration 250. The Space Shuttle Orbiter Middeck can be used as the payload carrier for this apparatus. A payload mounting panel (PMP) will be used to mount the experiment locker into the payload carrier location. This locker configuration may be designed to be a cabin air breather. Payloads that are located in the Orbitor Middeck may be in the following areas: (a) aft surface of wire trays of Avionics Bays 1 and 2, or (b) forward surface of wire trays of Avionics Bay 3A. Of course, the availability of specific locations for payload use may be subject to the amount of ducted and non-ducted air cooling, power required by the individual middeck payloads, mission profile and its length, the size of the Orbitor crew, and amount of crew equipment to be stowed in standard stowage lockers at these locations.

Figure 6B:
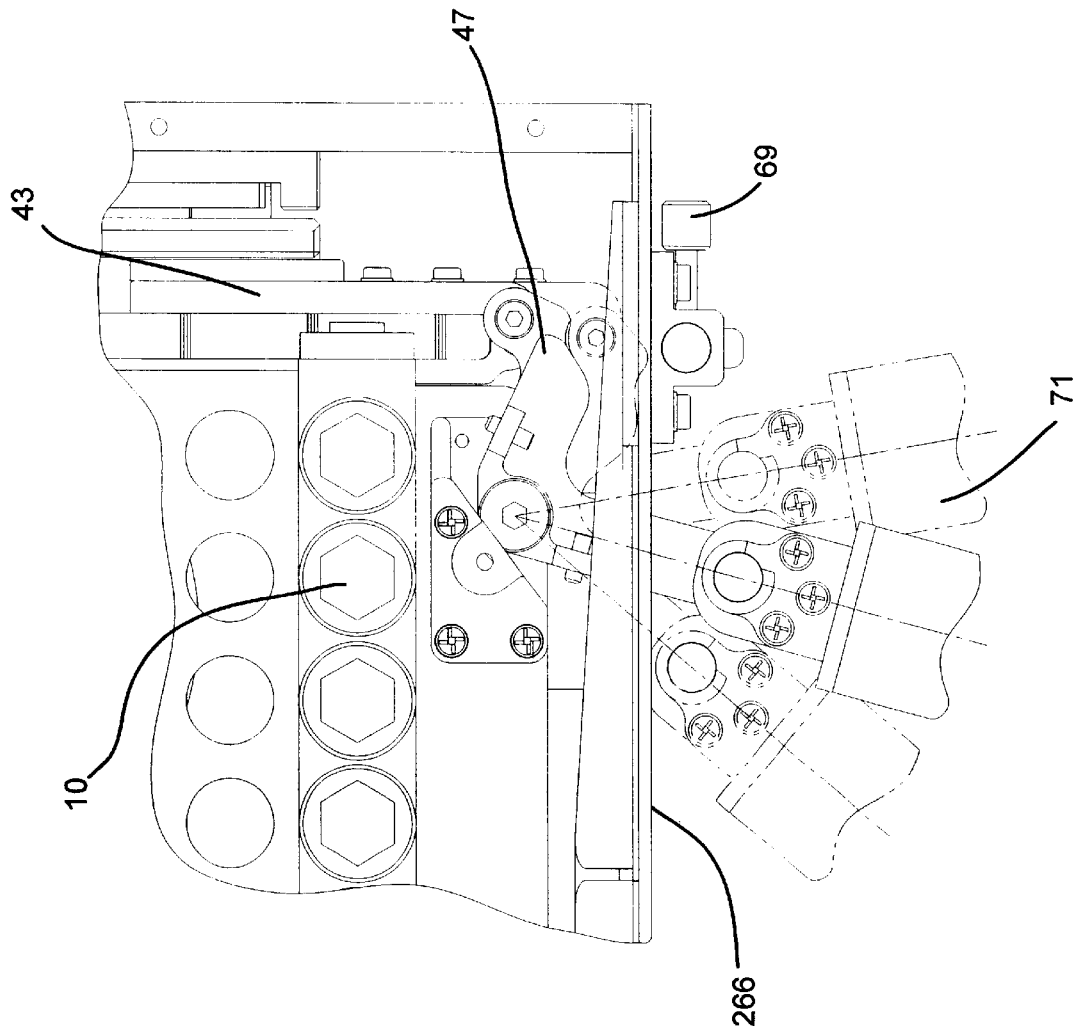
FIG. 6B illustrates one example of one embodiment of a pivot assembly pivot rotation.

FIG. 6B illustrates the actuator handle 71 at various positions while in the process of activating/deactivating an experiment. As the actuator handle 71 is rotated, the pivot assembly 47 rotates to activate/deactivate the experiment.

As illustrated in FIG. 6A the HDPCG experiment is easily activated, or deactivated by the use of a Activation/Deactivation Handle 68. The handle 68 can be retrieved from possible stowage within the C-RIM 62 with installed HDPCG apparatus, as shown in FIG. 6B. In order to activate/deactivate the experiment the C-RIM door 70 must be opened. This allows the retainer door 66 to be visible. There are 12 slots 79 that are accessible on the retainer door 66. Each slot corresponds to a tray 42 located within the HDPCG apparatus. This allows for the ease and flexibility of activating/deactivating a tray 42 individually.

Figure 6C:
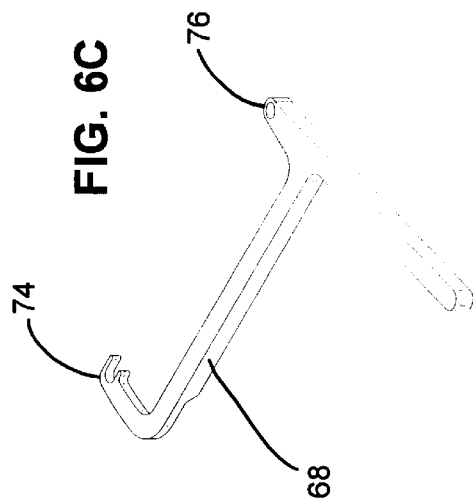
FIGS. 6C–D illustrate one example of one embodiment of an Activation/Deactivation tool and incubator assembly.

FIG. 6C illustrates another embodiment of an activation/deactivation handle 68. In order to activate the tray 42 the handle 68 is inserted through one of the slots 72. The handle 68 is then used to engage a pin (not shown) on the rack with a slot 74. The handle 68 has a pivot 76 and pivots on the retainer door 66 where it can be rotated 60° clockwise (CW) to activate the sample tray 42. The handle 68 will activate both sides of the sample tray 42, one side at a time. The opposite side of the sample tray 42 is then activated by removing the handle 68 and rotating it 180°. Once again the handle 68 is inserted through two of the slots 72 in order to activate the opposite side of the sample tray 42. Once the pin 78 is engaged the handle is rotated 60° counterclockwise (CCW). This completes the activation sequence for the sample tray 42.

Figure 6D:
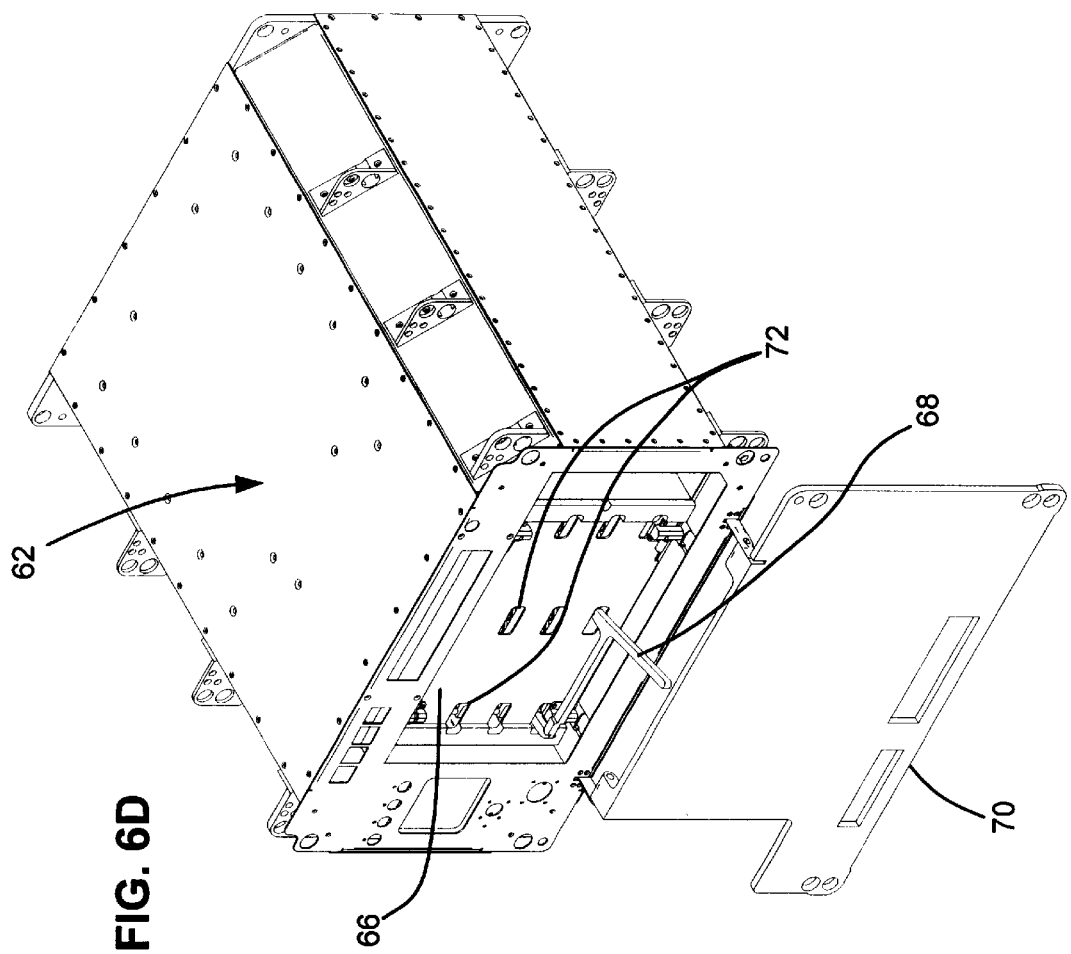

FIG. 6D illustrates the handle 68 in operation. The handle 68 is first retrieved from stowage, then the C-RIM door 70 is opened and the retainer door 66 becomes visible. The handle 68 is inserted through the slots 72 on the retainer door 66 corresponding to the sample tray 42 that is to be deactivated. Once the pin (not shown) on the rack is engaged, the handle 68 is rotated 120° CCW to deactivate. The opposite side of the sample tray 42 is then deactivated by removing the handle 68 and rotating it 180°. Once the pin 78 on the rack is engaged, the handle is rotated 120° CW to deactivate the opposite side of the sample tray 42. This completes the deactivation sequence for the sample tray 42.

Figure 7:
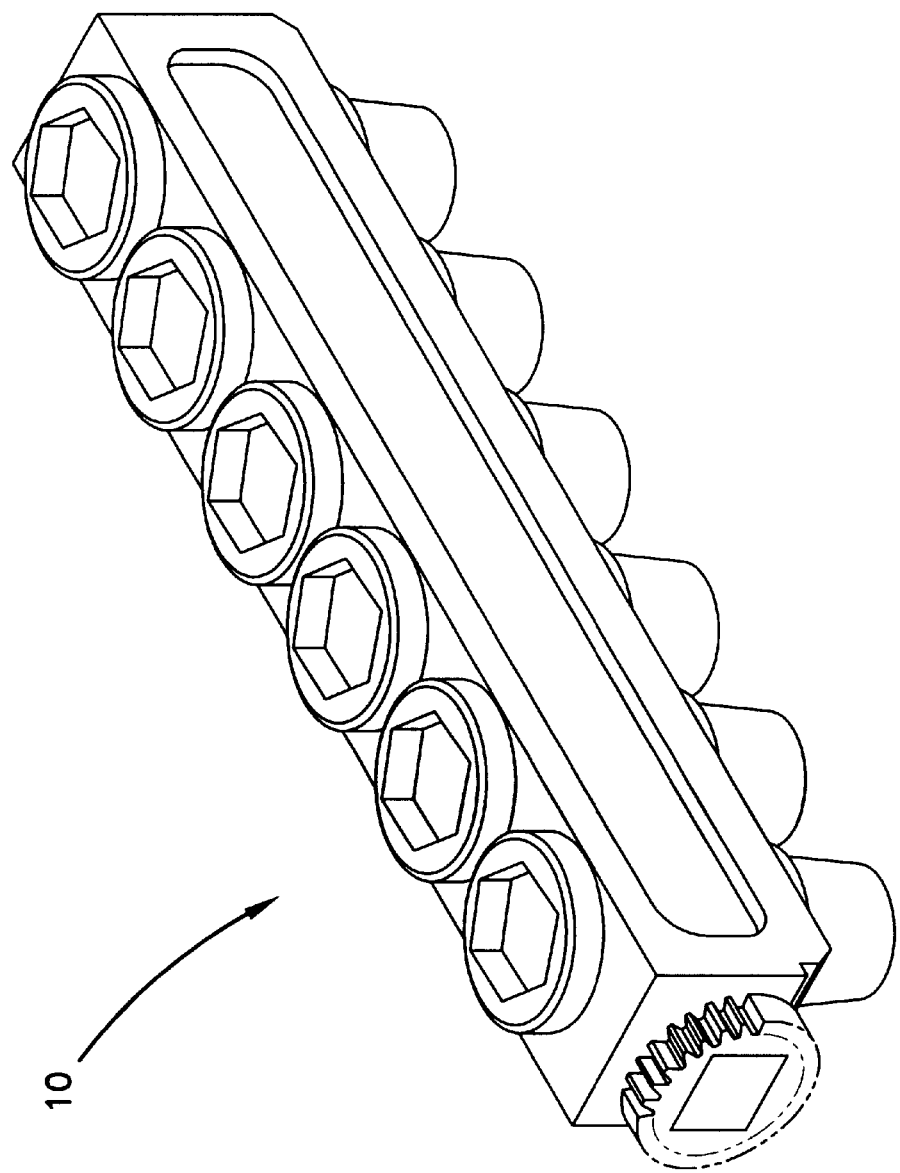
FIG. 7 illustrates one view of one embodiment of a high density protein crystal growth cell assembly.

FIG. 7 illustrates another view of one embodiment of a High Density Protein Crystal Growth growth cell assembly 10.

Figure 8:
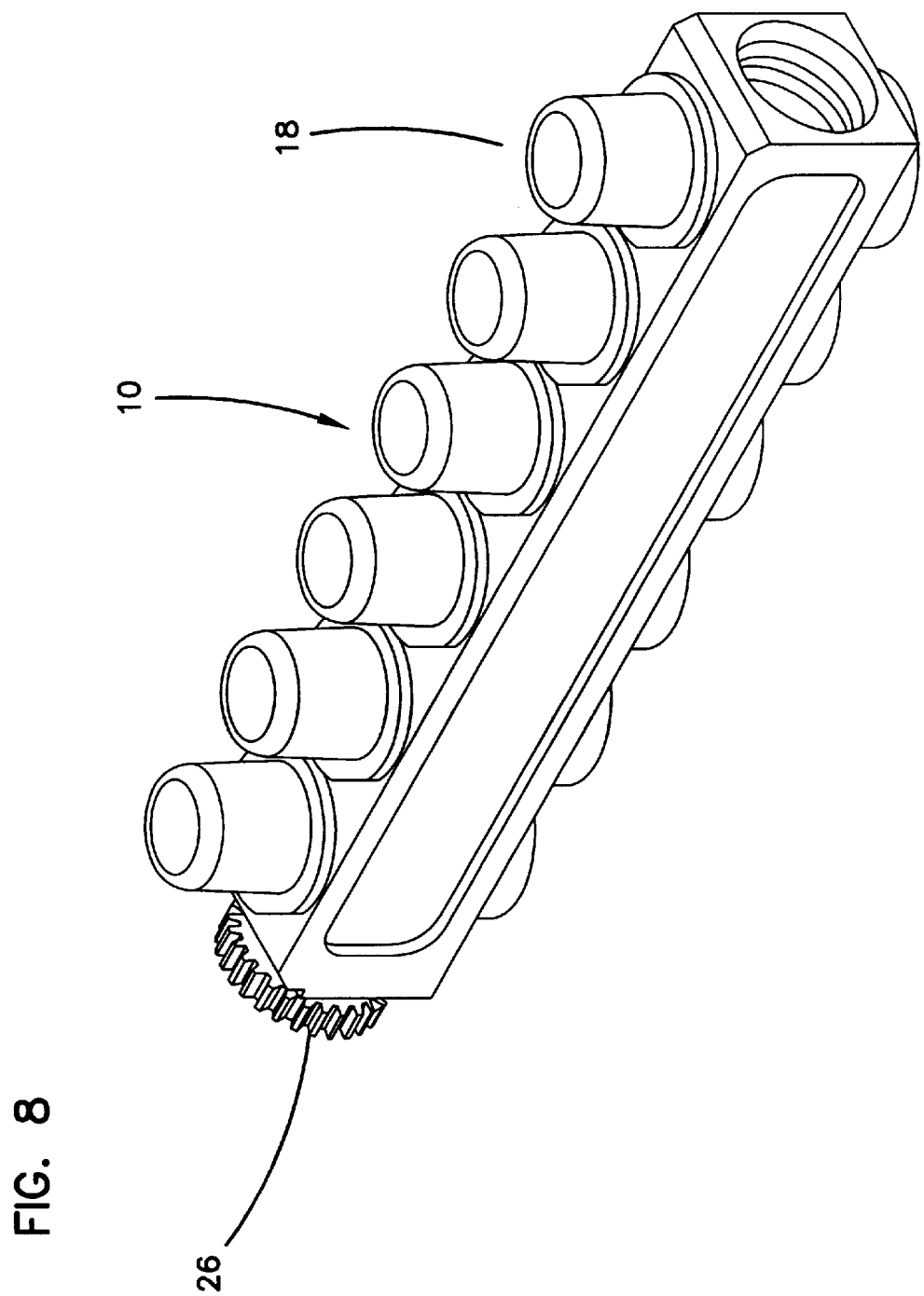
FIG. 8 illustrates one view of one embodiment of a precipitant (PPT) reservoir and protein crystal growth cell assembly.

FIG. 8 illustrates one embodiment of a PPT reservoir 18 of the growth cell assembly 10, made from Molded Clear Polysulfone P1700 and, for example having a fluid capacity of ½ milliliters. The PPT reservoir 40 houses a CHROMEX barrier to contain the reservoir solution. CHROMEX is one example of a ultra high molecular weight polyethylene material.

Figure 9:
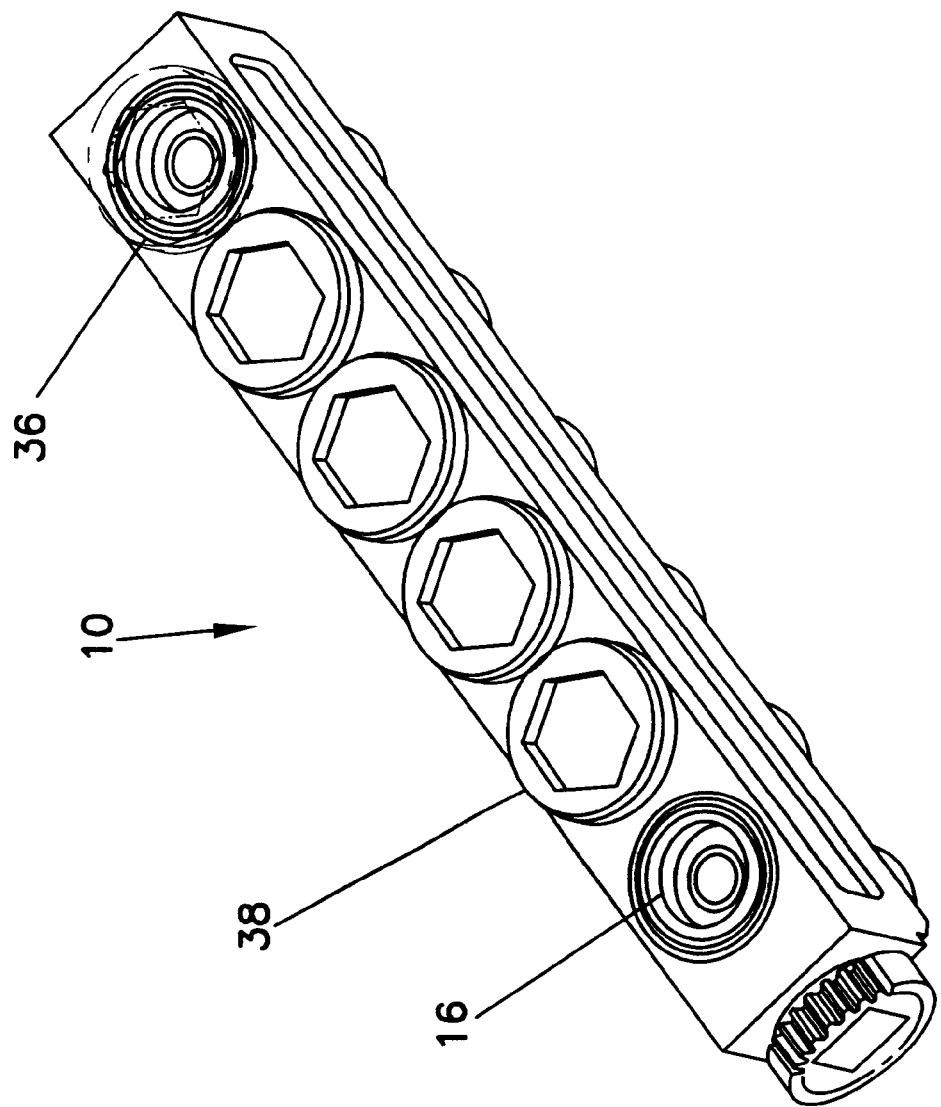
FIG. 9 illustrates one view of one embodiment of a protein crystal growth cell assembly illustrating an example of a high density access cap.

FIG. 9 illustrates another view of one embodiment of a growth cell assembly 10 illustrating the hd access cap 38 which is designed in conjunction with the XCF CPPI for remote access by means of the hex head cap. Access to the protein insert is obtained by rotating the access cap 38 45 degrees. The O-rings reside in the containment 36. The protein insert 16 can be removed from the back without having to disassemble the entire block. Both the access cap 38 and protein insert 16 can be molded from optical grade LEXAN for clarity.

Figure 10A:
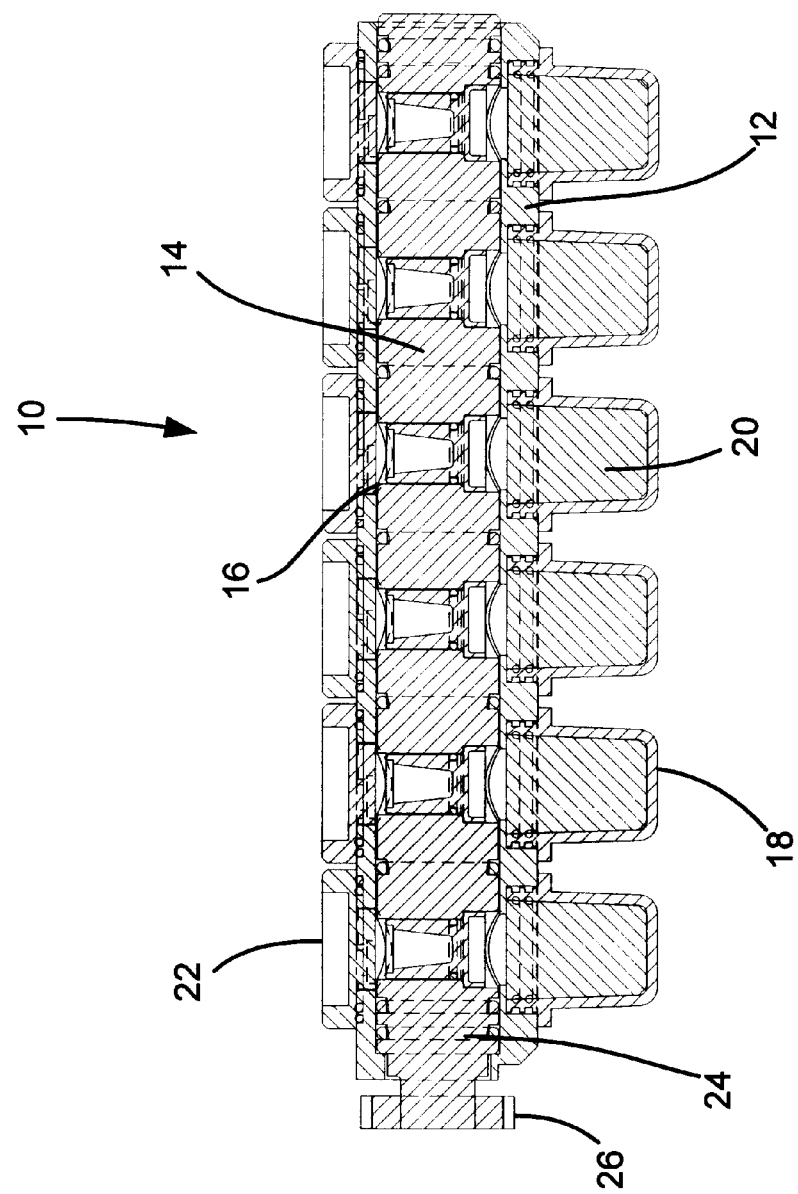
FIG. 10A illustrates a sectional view of one example of one embodiment of a protein crystal growth cell assembly in its fill/removal position.

FIG. 10A illustrates a sectional view of one embodiment of a growth cell assembly 10 in its fill/removal position. Note the position of the protein insert 16.

Figure 10B:
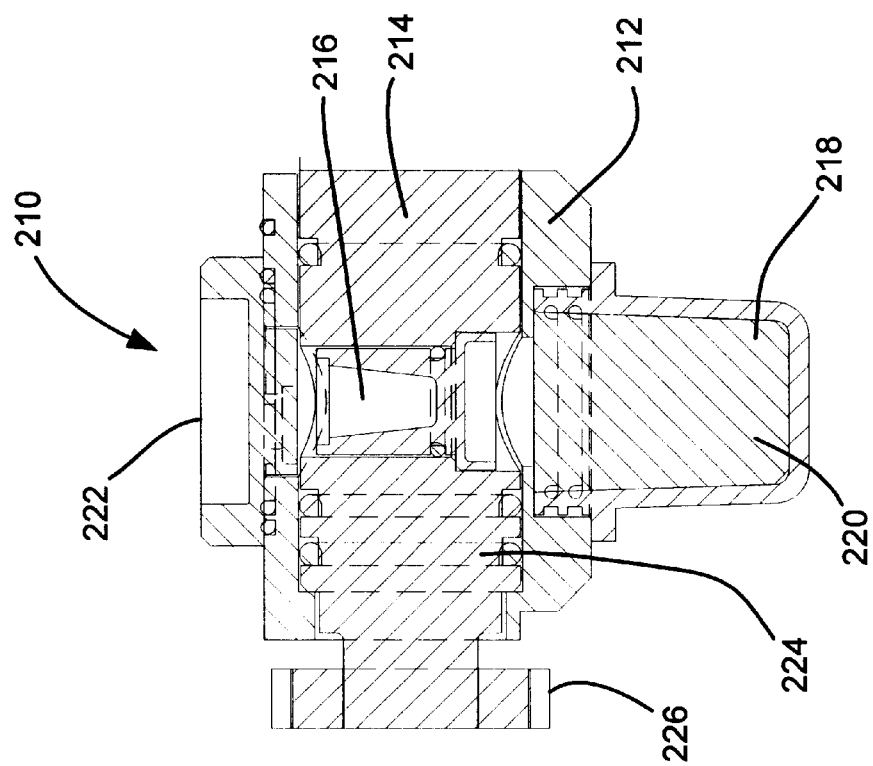
FIG. 10B illustrates a sectional view of one example of embodiment of a single protein crystal growth cell assembly in its fill/removal position.

FIG. 10B illustrates a sectional view of one embodiment of a single growth cell assembly 210 in its fill/removal position. Note the position of the protein insert 216. The single growth cell assembly 210 comprises the cell body 212, the cell barrel 214, protein insert 216, PPT reservoir 218, CHROMEX barrier 220, hex head access caps 222, O-ring 224 and a spur gear 226.

Figure 11B:
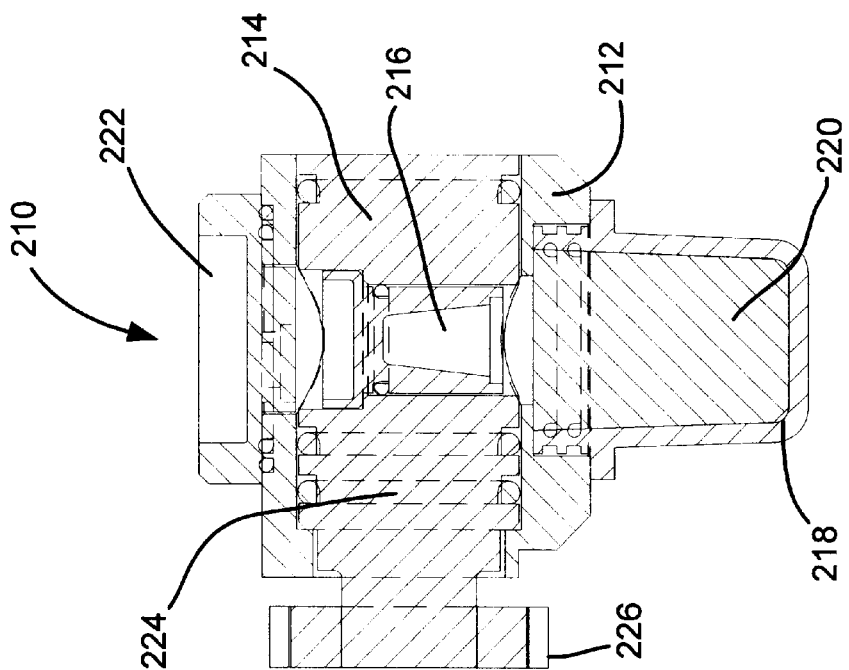
FIG. 11B illustrates a sectional view of one example of embodiment of a single protein crystal growth cell assembly in its growth position.
Figure 11A:
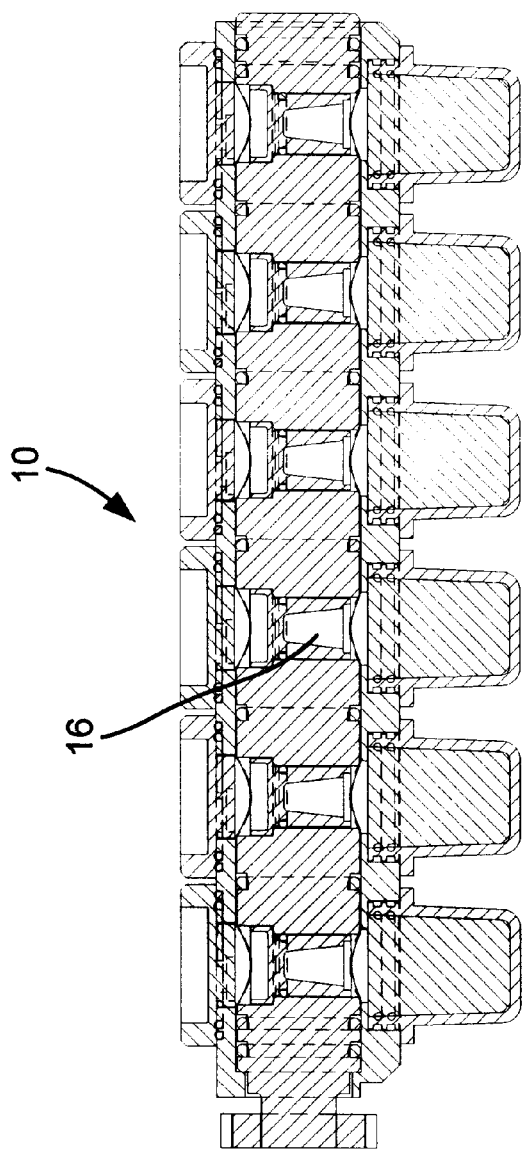
FIG. 11A illustrates a sectional view of one example of one embodiment of a protein crystal growth cell assembly in its growth position.

FIG. 11A illustrates a sectional view of one embodiment of a growth cell assembly 10 in its growth position. Note that the position of the protein insert 16 is opposite to that shown in FIG. 10A.

FIG. 11B illustrates a sectional view of one embodiment of a single growth cell assembly 210 in its growth position. Note that the position of the protein insert 216 is opposite to that shown in FIG. 10A.

Figure 12C:
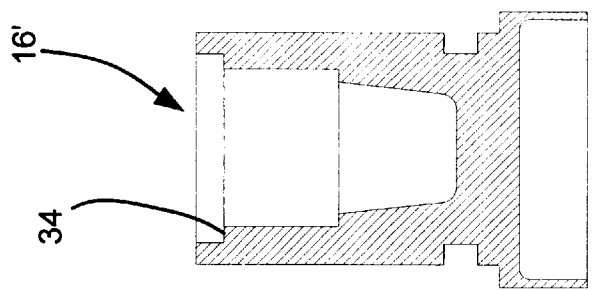
FIGS. 12A–C illustrate examples of various embodiments of a protein cell insert.
Figure 12B:
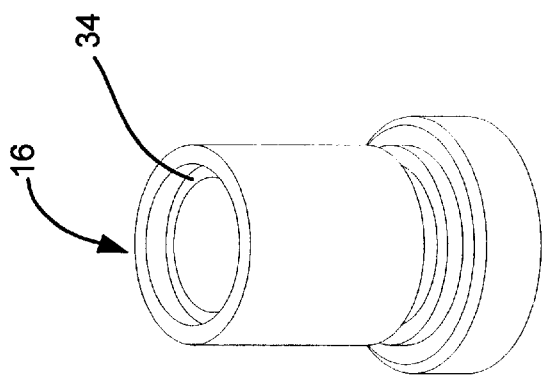
Figure 12A:
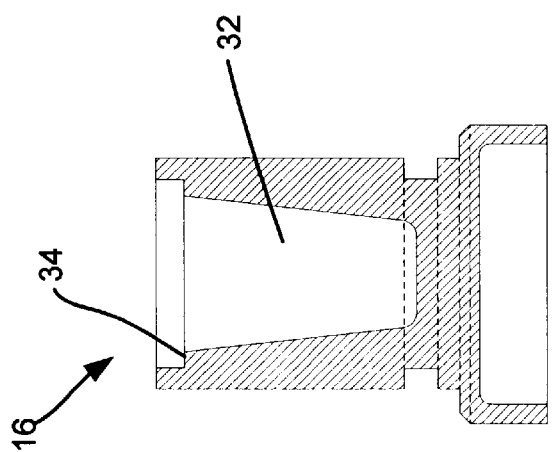

FIGS. 12A–C illustrate various embodiments of a protein insert 16 produced by LIGHTWAVE PRODUCTS. The protein insert 16 holds up to 50 micro-liters, is made for example of optical grade LEXAN and includes a tapered well 32 as determined by the KC-135 zero gravity test plane and is available in an optional molded version. The modified protein inserts 16' have a volume capacity of 20 microliters or less. Pinning edge 34 will restrict drops from wicking up the walls while in micro-gravity.

Figure 13:
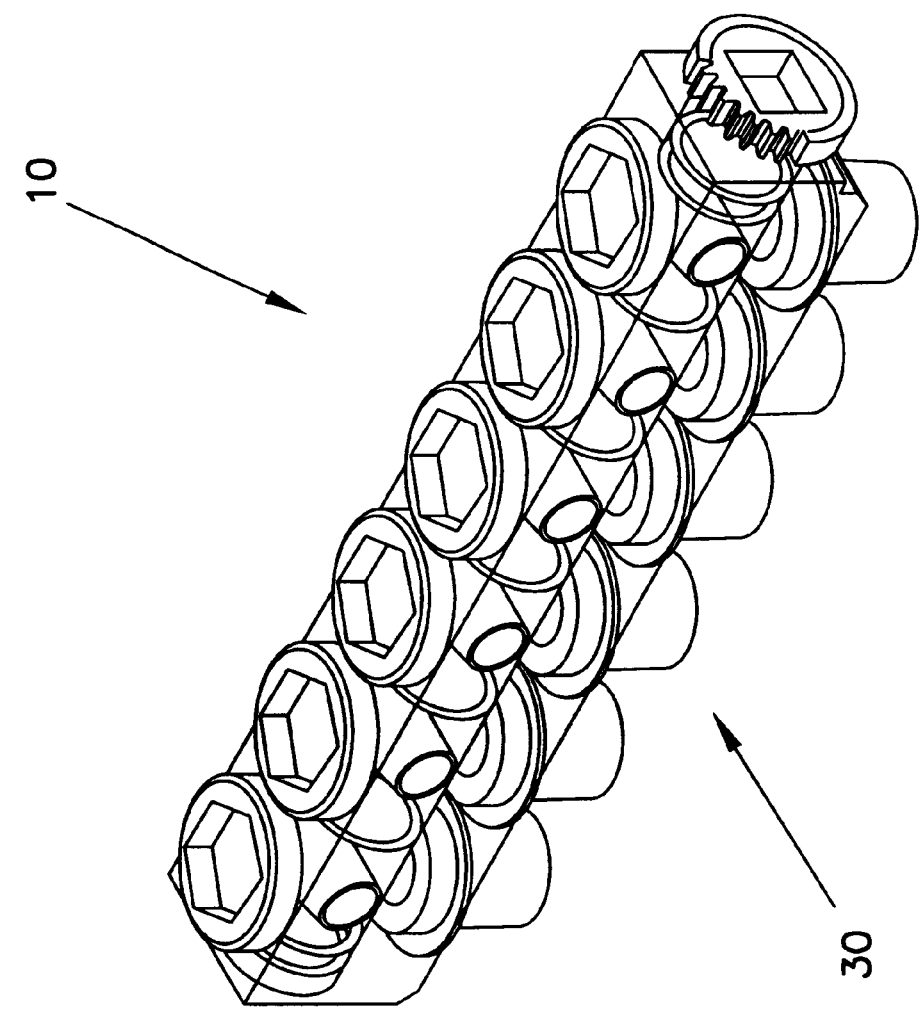
FIG. 13 illustrates one example of one embodiment of a protein crystal growth cell assembly in a launch configuration and direction of a corresponding launch G-Force vector.

FIG. 13 illustrates one embodiment of a growth cell assembly 10 in its launch configuration and corresponding launch G-Force vector 30.

Video Command and Monitoring System (VCMS) System Description

As part of the overall system, the present invention provides a Video Command and Monitoring System (VCMS) that is part of the second phase of a three phase program for commercial protein crystal growth (CPCG). The VCMS system will be used to evaluate protein crystal quality, size, location within HDPCG (CPCG-H) tray, and the potential for X-ray data collection.

Figure 15A:
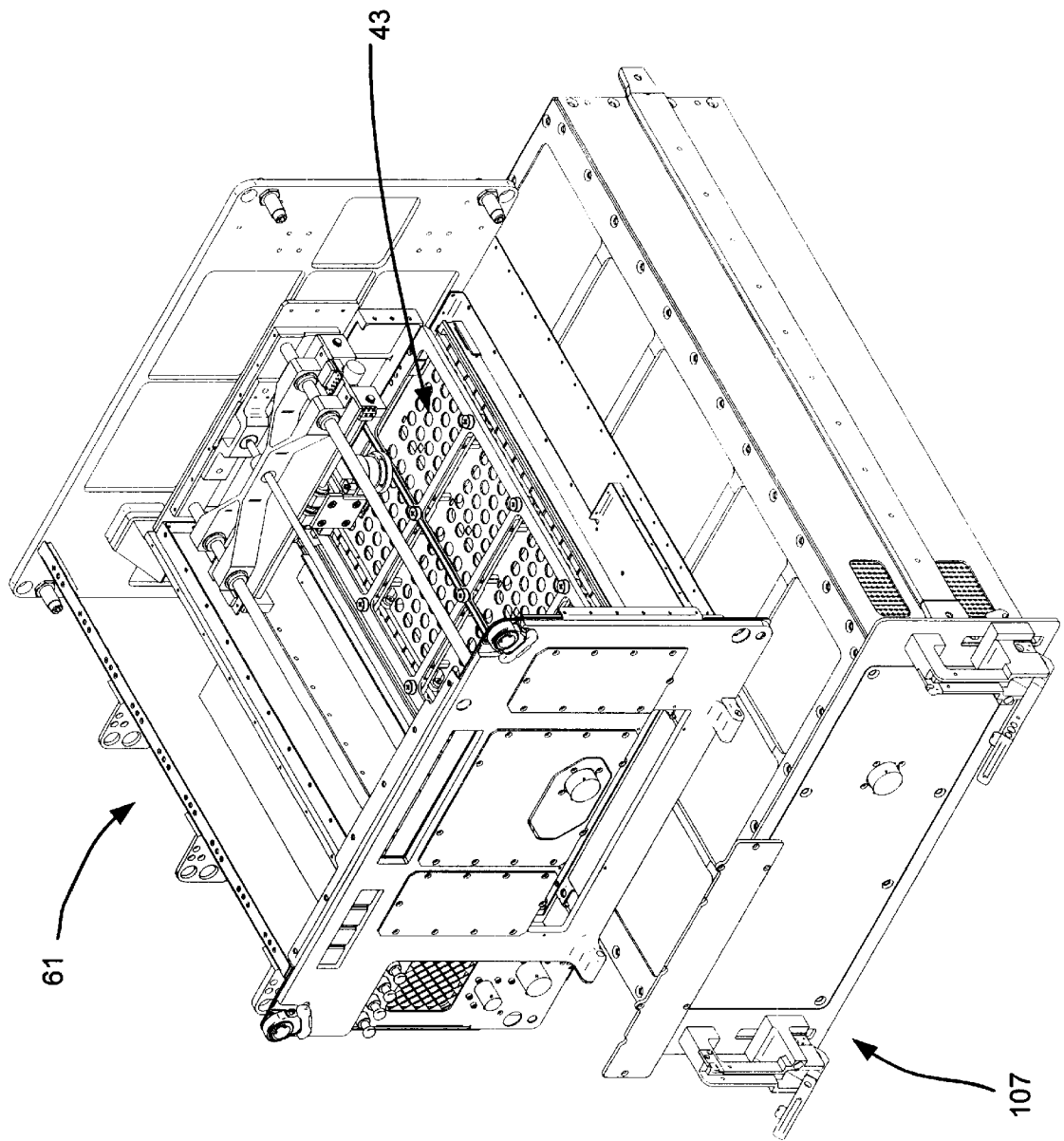
FIGS. 15A–B illustrate examples of embodiments of a VCMS chassis and a VCMS controller.

FIG. 15A illustrates one embodiment of a CPCG payload complement comprising three components: a HDPCG stacked tray assembly 43 (CPCG-H), a VCMS—video & translation chassis 61 (CPCG-V) and a VCMS—controller 107 (CPCG-C). The HDPCG tray assembly 43 and VCMS 61 payloads will reside in thermal carriers.

Figure 15B:
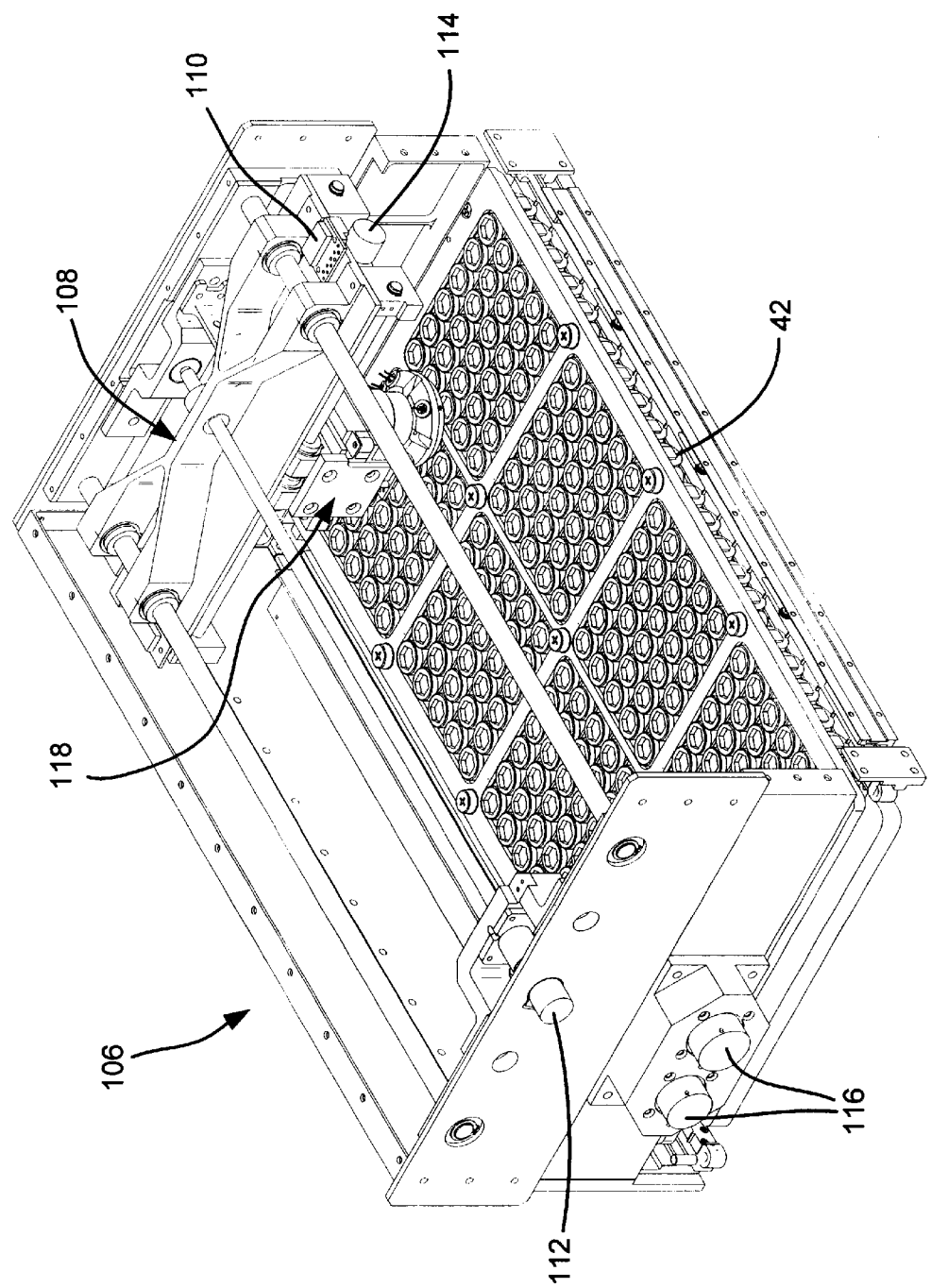

FIG. 15B illustrates another embodiment of a the VCMS chassis 106 that houses the video camera assembly 118 and the HDPCG tray assembly 42 during experiments. The chassis 106 further includes an X-Y stage with the mounted video camera assembly 108, the X-Y stage including an X-stage stepper motor 112 and a Y-stage stepper motor 114. The X-Y stage assembly 108 indexes a translating camera assembly 118 utilizing a Y stage stepper motor 114 and an X stage stepper motor 112. The X and Y stage stepper motors 112, 114, respectively, are interfaced with the VCMS controller 84 via controller connectors 116. The system further provides flexible cable routing that interfaces with a flex cable zero insertion force (ZIF) connector 110.

Figure 16A:
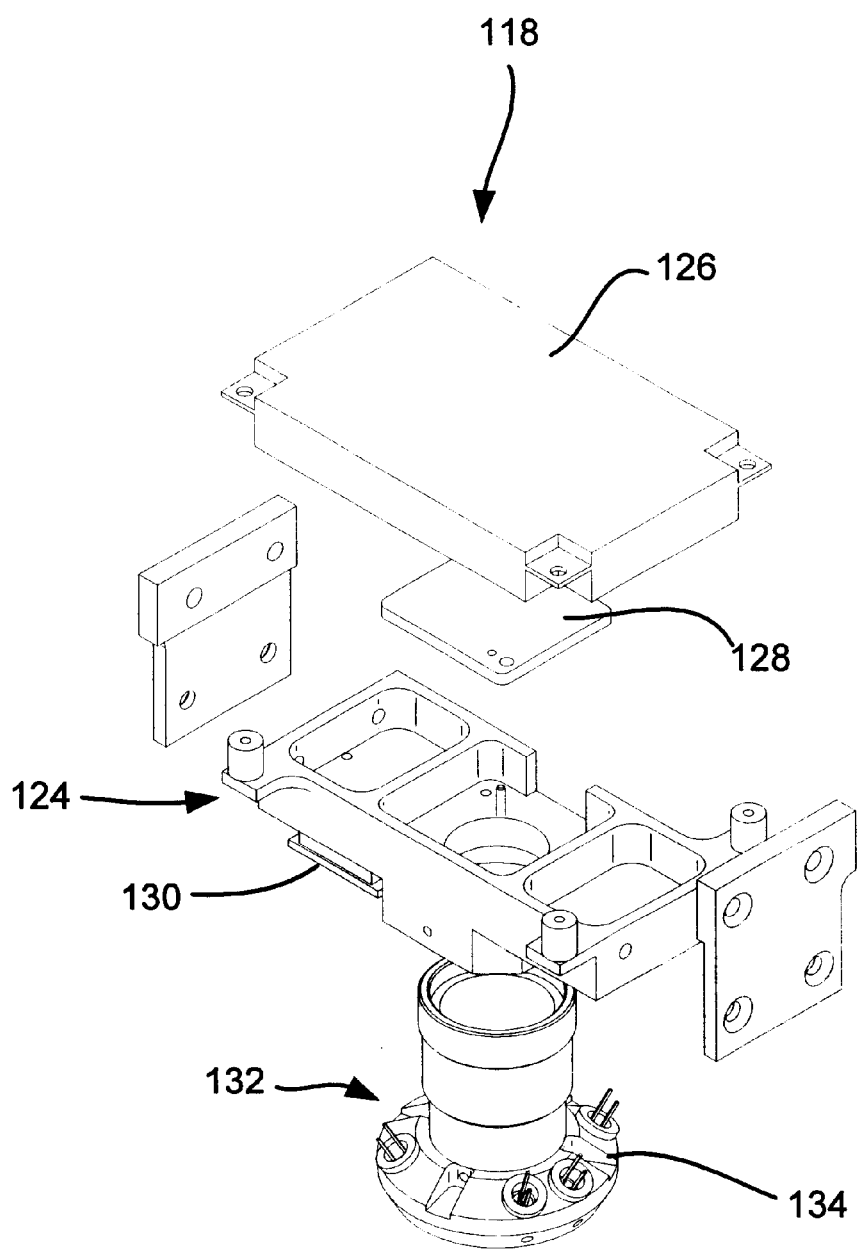
FIGS. 16A–F illustrate several views of one example of one embodiment of a translating video camera assembly and components.
Figure 16B:
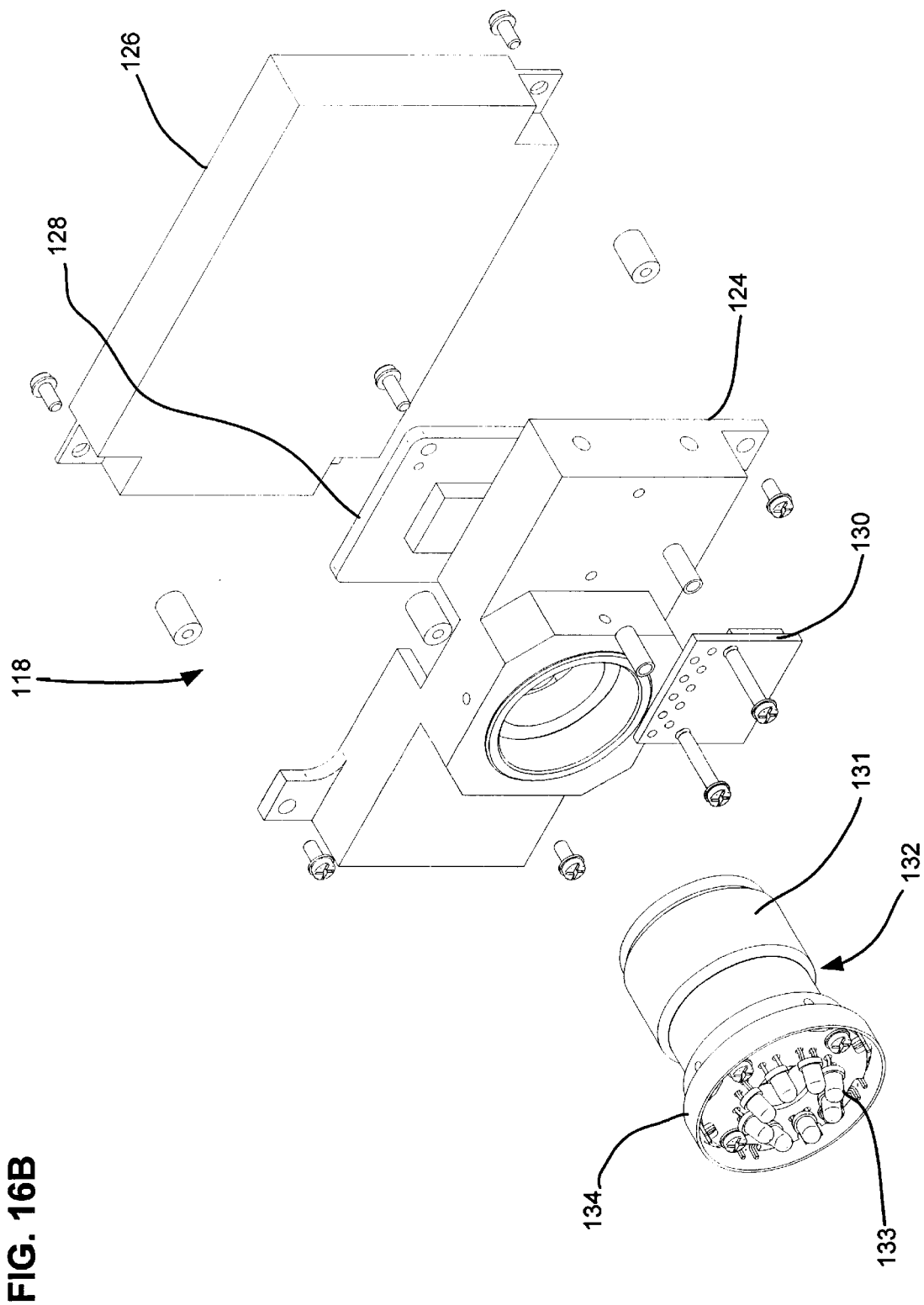

FIGS. 16A–F illustrate embodiments of the translating camera assembly 118. Digitized images are down-linked to ground support equipment (GSE) for the scientists to observe. The video camera assembly 118 comprises a lens assembly 132, light ring 134, video camera electronics 126, mounting assembly 124, a charge coupled device (CCD) head 128 and connectors for printed circuit board (PCB) 130. One embodiment of how a camera is assembled is shown in FIG. 16B. The lens assembly 132 provides the camera with a fixed focus image of the growth cell 10. The light ring 134 including 8 light emitting diodes 133 (LEDs) is attached to the base of the lens assembly 132 to the lens body 131 to provide adequate illumination during video frame acquisition.

As illustrated in FIGS. 16A–B the translating video camera assembly 118 comprises a mounting assembly 124 for mounting the camera assembly 118 to the VCMS chassis 61 X-Y stage. The camera assembly 118 further includes a Charge Coupled Device (CCD) head 128 and connectors for printed circuit board (PCB) 130. The camera utilized in the preferred embodiment of the present invention is a Sony CCB-GC7YC color card camera detachable head with ⅓" CCD 768×494 CCD elements integral DC/DC converter, Y/C and composite outputs, 470 TV lines and 5 Lux sensitivity at F1.2.

Figure 17:
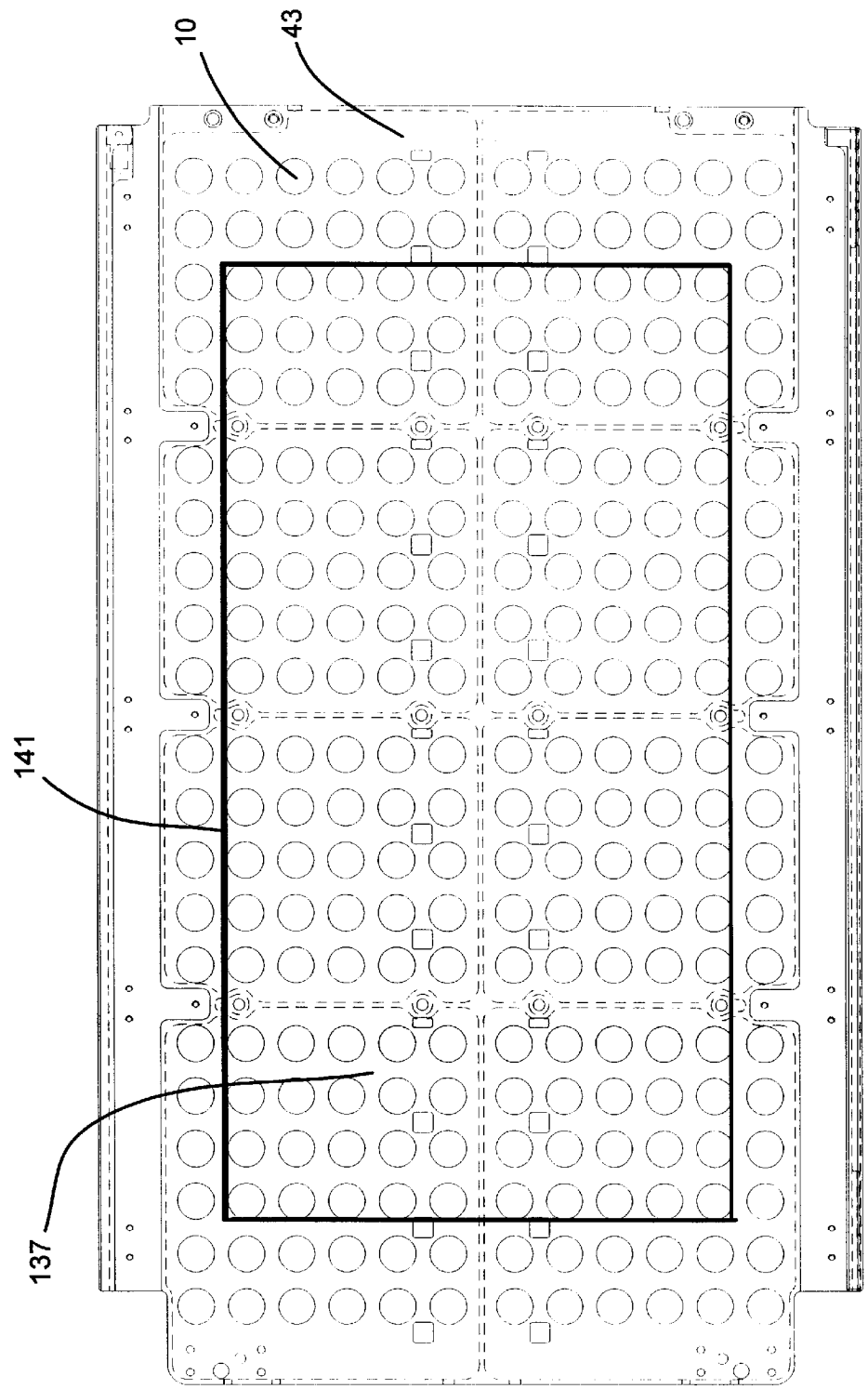
FIG. 17 illustrates an example of a diagram of a video camera growth cell coverage area.

The camera assembly 118 is mounted to the stage provided by the VCMS chassis 61 where it can translate in the X and Y directions, via mounting assembly 124. This translation allows for flexibility in viewing individual HDPCG growth cells 10 within the designated cell coverage area 137 (FIG. 17). In one embodiment, a video camera growth cell 10 coverage area 137 is about 68% of the top side HDPCG tray 43. The video camera provides a high-resolution, color, Y/C signal to the controller's 107 electronic video capture hardware.

Figure 16C:
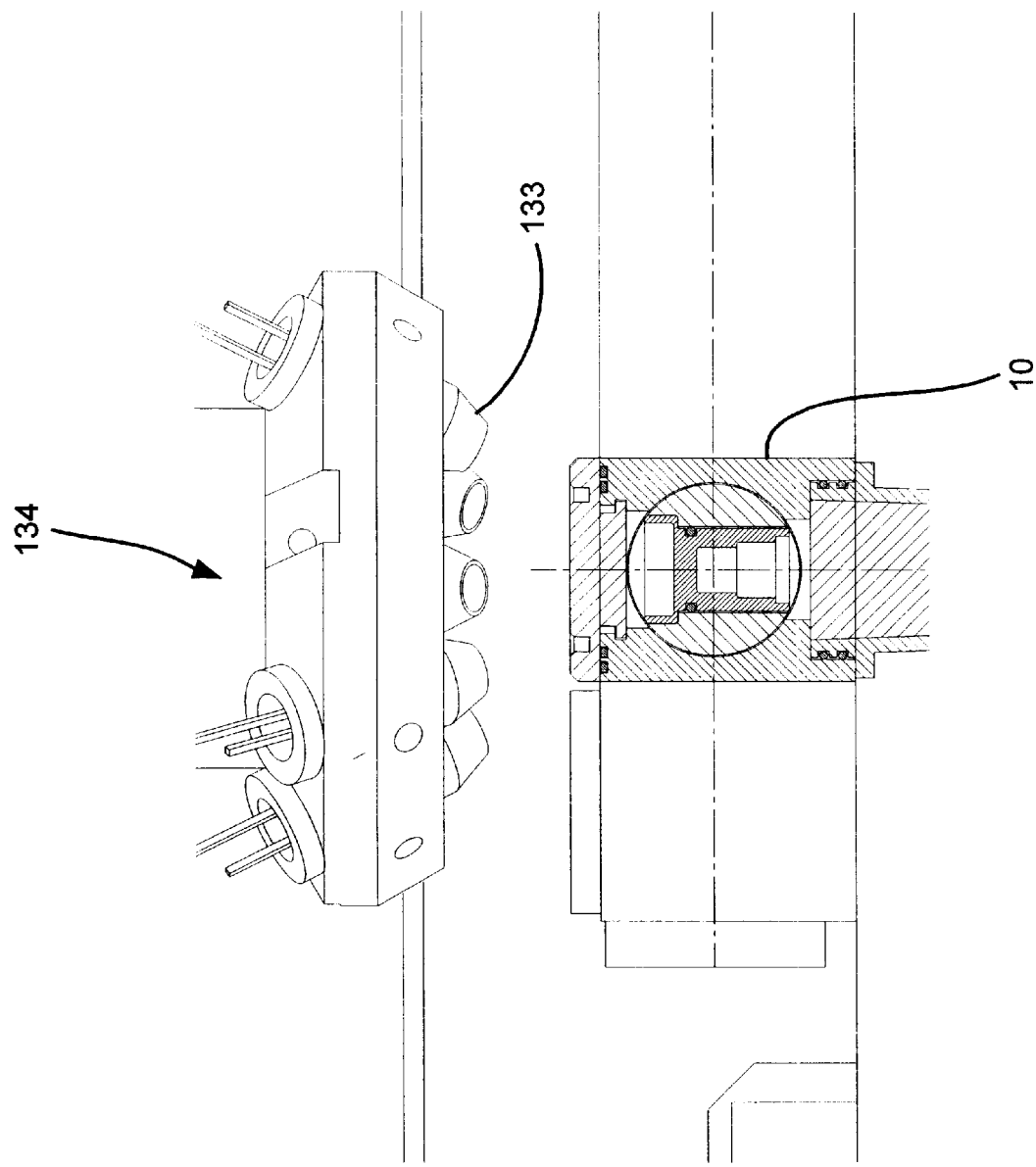

FIG. 16C illustrates the cell illumination light ring 134 attached to base of the lens. The light ring 134 including the eight sleeve mounted concentric white LED's 133 are manufactured by Sylvania Lighting International model number CMD1224WC.

Figure 16D:
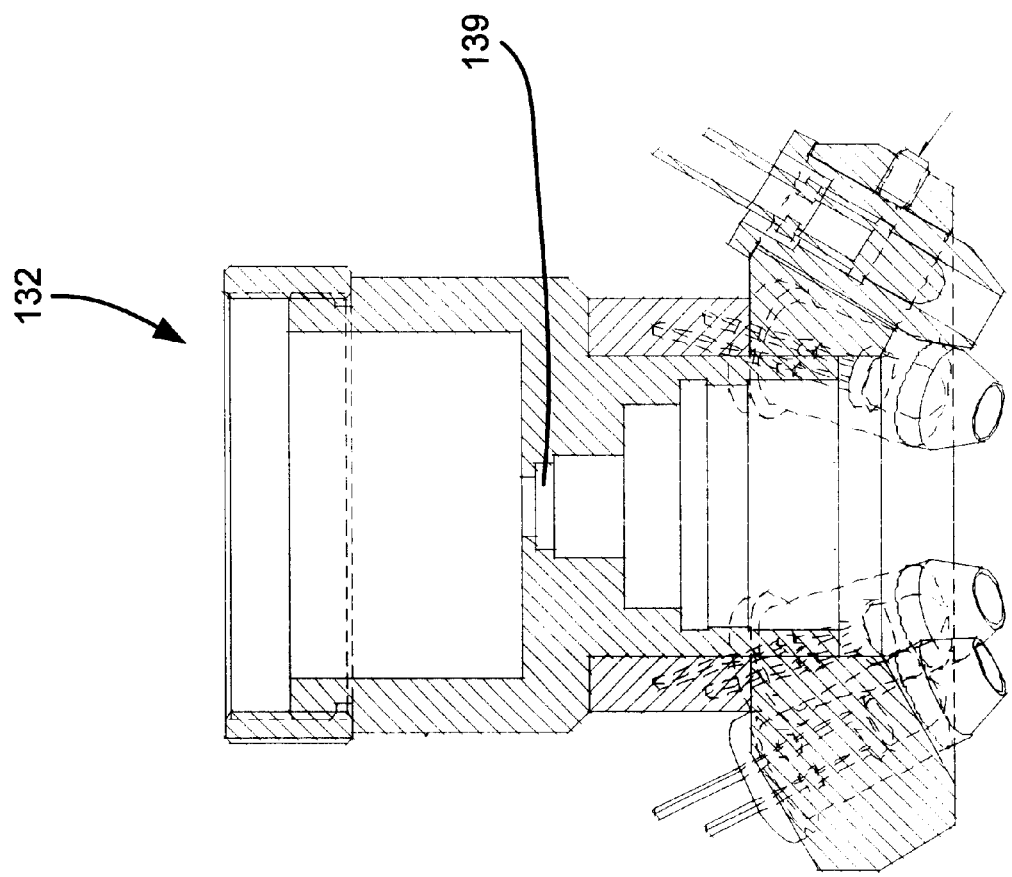

As illustrated in FIG. 16D the lens assembly 132 provides the camera with a fixed focus image of the growth cell. On the base of the lens there is a light ring that provides illumination during the video process. The assembly 132 is mounted to the X-Y stage provided by the chassis 61 where it is capable of translating in the X and Y directions. This adds the flexibility of viewing individual HDPCG growth cells within the designated cell coverage area (FIG. 17). An example of a lens assembly 132 is one custom fabricated by Optem International and includes a CS mount assembly 134, Edmund Scientific A45,207 lens 139 that is achromatic coated with a ¼ Wave $MgF_2$@550 nm, a 5 mm diameter and 15 mm focal length, and a Rolyn A32,623 Precision iris diaphragm including a 8.0–0.7 mm aperture and 8 blade blued spring steel.

Figure 16E:
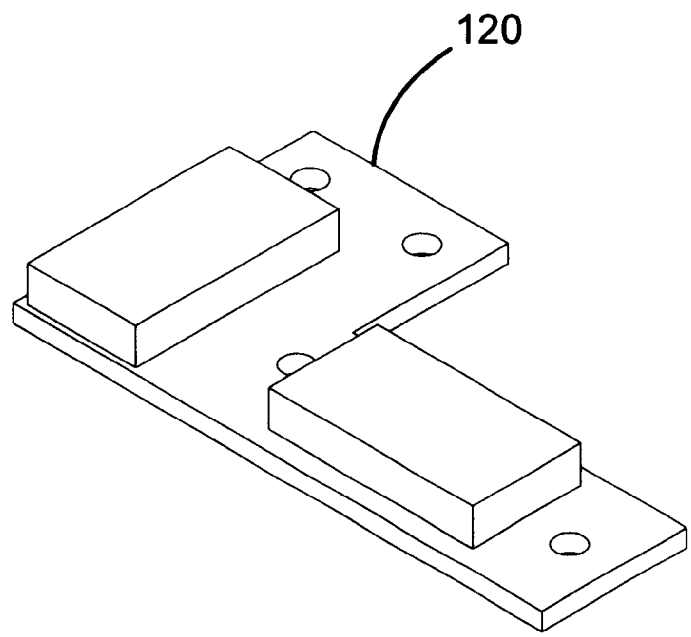
Figure 16F:
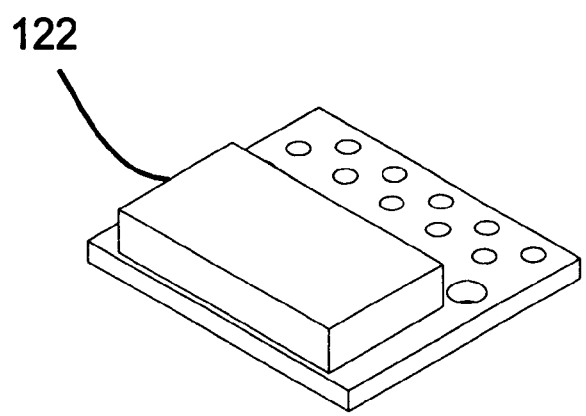

Flexible circuits 120 and 122 illustrated in FIGS. 16E and 16F, respectively, reduce the overall size, weight and assembly costs of the design. Further, the flexible circuits 120, 122 increase the system reliability, ease design (packaging in 3-dimensions), are mechanically robust and provide excellent electrical properties, for example, low strip resistance and small channel—channel capacitance.

As illustrated in FIG. 17, the VCMS System is capable of translating the video camera assembly 118 and taking periodic "snap shots" of indicated growth cells within an area of camera coverage 137 bounded by perimeter 141.

Figure 18:
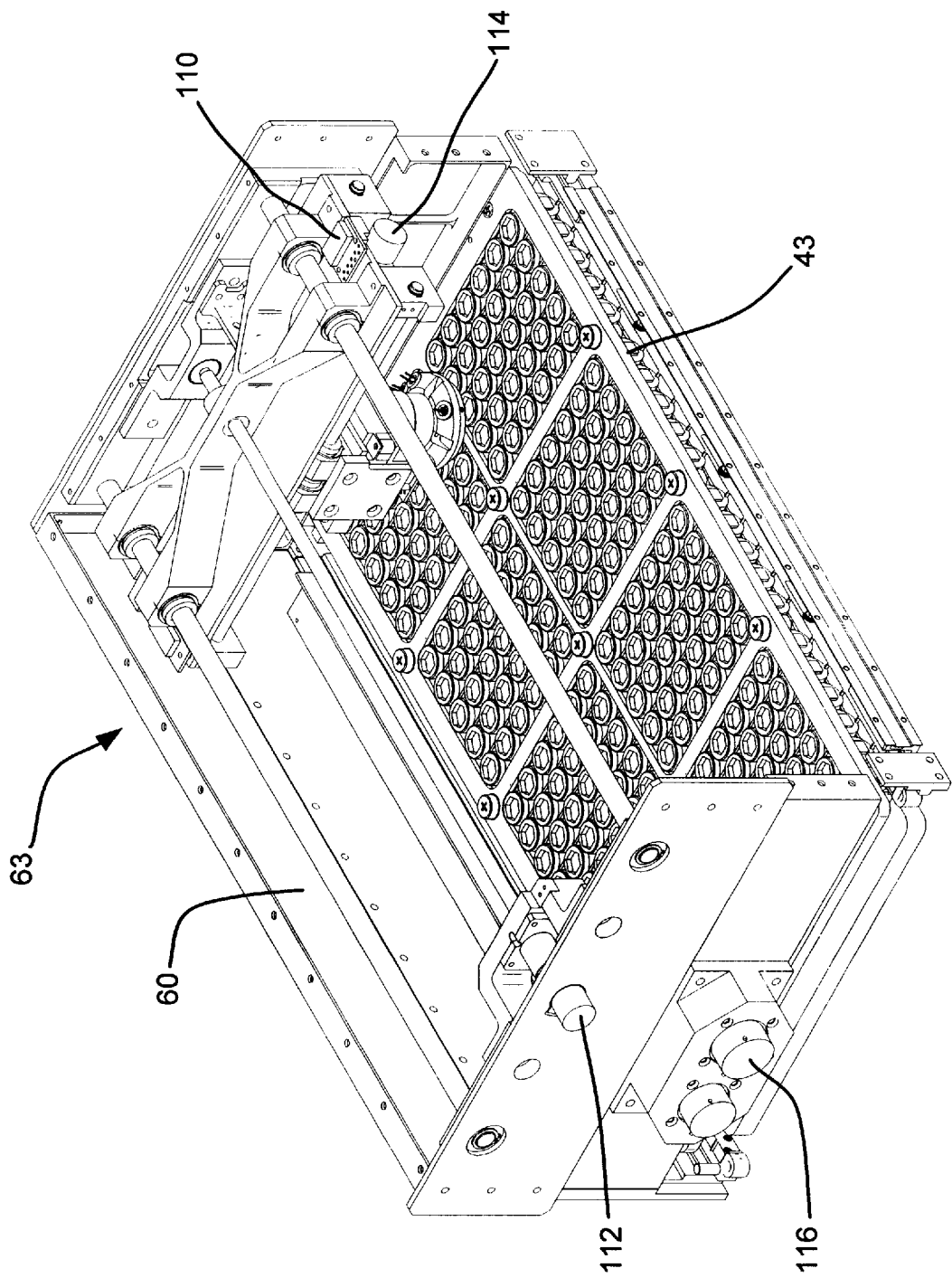
FIG. 18 illustrates one example of one embodiment of a VCMS chassis for a commercial protein crystal growth-V (CPCG-V) with hot wall removed for clarity.

As illustrated in FIG. 18, one embodiment of a VCMS chassis 61 is the structure designed to house the video camera assembly 118 and the HDPCG tray assembly 43 during an experiment. The chassis 61 includes the X-Y stage with the mounted camera assembly 118, X-stage motor/encoder 112, Y-stage motor/encoder 114, controller connector 116, flex cable connectors 110 linking the moving stages to the chassis, and installed HDPCG tray assembly 43. A sensor detects the presence of sample trays. This interlock is then used in the system software routines. Each end of the camera stage axes also has limit switches used in the software control routines.

Figure 19:
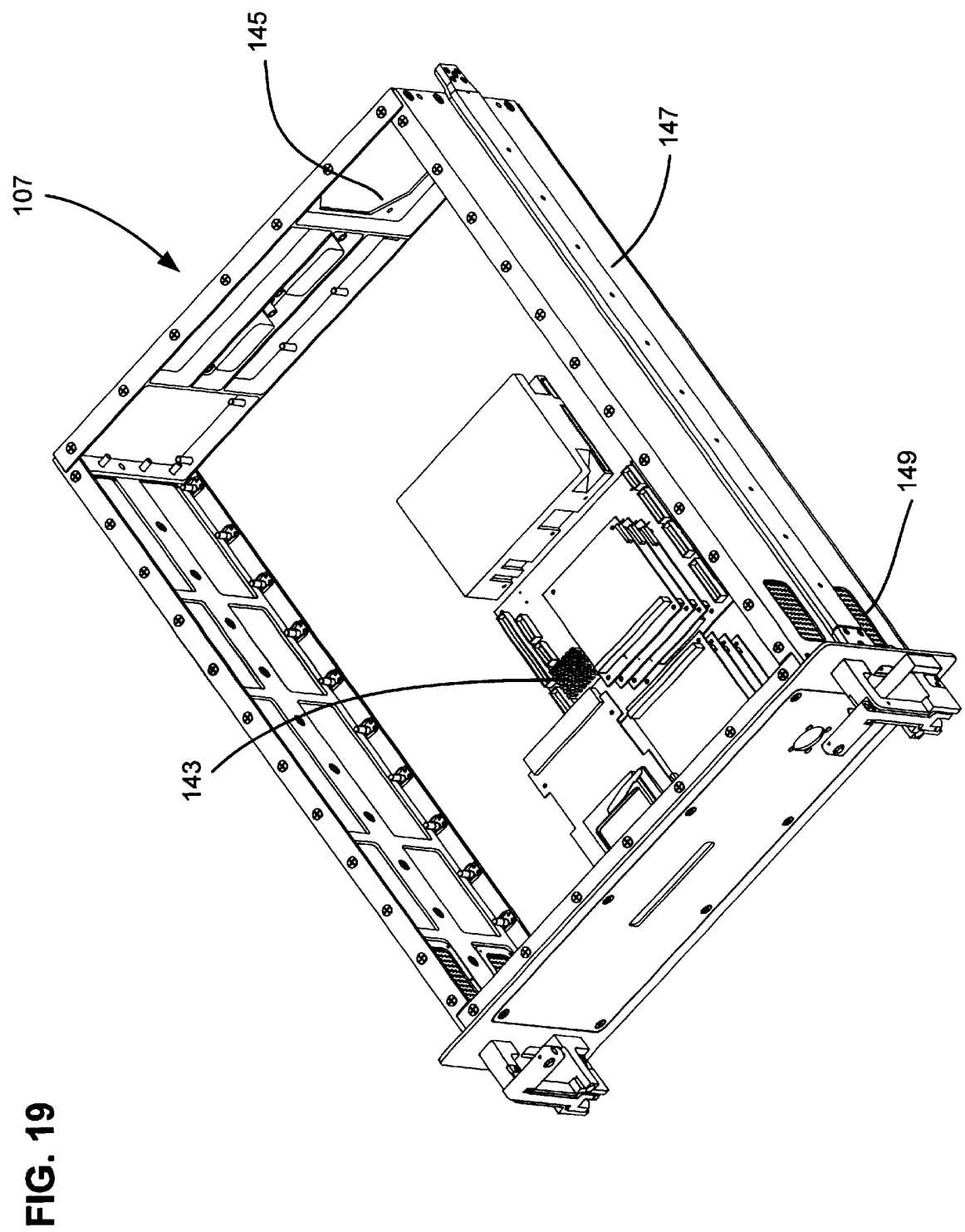
FIG. 19 illustrates one example of one embodiment of a VCMS controller for CPCG-V with top panel removed.

As illustrated in FIG. 19, one embodiment of a controller 107 is suitable for residing in an International Sub-rack Interface Standard Drawer (ISIS) 147. The VCMS 61 payload will include one Middeck Locker Equivalent (MLEs) containing hardware for protein crystal growth experiment monitoring (CPCG-V) and one experiment ISIS Drawer 147 (CPCG-C) containing control electronics 143. The VCMS is used in conjunction with the HDPCG flight assembly. The VCMS will occupy one HDPCG tray at a given time, but the VCMS has the versatility of interchanging HDPCG Trays whenever scheduled or requested.

In one embodiment, a VCMS controller 107 contains the system electronics 143. The controller has five primary functions that include: translation, video capture, disk storage, health and status, and communications. The controller 107 may be located in a four-panel unit (4PU) EXPRESS Rack ISIS drawer 147. The components are mounted to the modified baseplate of the drawer 147. The controller 107 will utilize the EXPRESS Rack internal air volume to reject heat from the VCMS controller 107. The ISIS drawer 146 is outfitted with a fan and appropriate air intake ventilation holes 149 to accomplish this heat rejection through the air exhaust vent 145. The VCMS controller 107 is monitored by both the software and hardware components. The CPCG-C system temperature(s) and system current(s) are monitored to determine the state of the electronics. Likewise, the hardware monitors vital system indicators to determine and control the state of the system.

The following hardware sub-assemblies make up the VCMS controller. An Intel 80486-based Single Board Computer (SBC) is the central processing unit. Attached to the SBC's PC/104 bus are a stepper motor controller card, an encoder feedback card, a video capture card, an analog to digital input output card, a Personal Computer Memory Card International Association (PCMCIA) solid state memory card, hard disk drive, and two DC/DC converter cards.

The VCMS controller 107 performs external communications through an Ethernet interface in the rear of the ISIS drawer 147. VCMS Health and Status (H&S) and all the down-link data passes through this interface. The Controller 107 is linked to the VCMS chassis 61 through a front panel cable. Secondary electrical supply voltages, control signals, and high-resolution Y/C video signals are routed through this cable.

The VCMS payload software will provide control of all phases of the experiment and requires limited crew involvement. The crew involvement will be required during initial experiment setup and activation, periodic status monitoring, experiment deactivation, and off-nominal activities. The VCMS payload software contains an applicable program interface to initiate, control, and monitor data acquisition from the experiment. Additionally, the VCMS payload software will manage data flow between the VCMS payload and the external interfaces. The major functions of the VCMS payload control software may include the following:

1. Provides for video data capture and storage of the payload;
2. Stores experiment data to disk;
3. Communicates with external computers;
4. Monitors system health/status;
5. Implements the periodic scan profiles for the HDPCG growth cells based upon the mask file;
6. Controls camera positioning system;
7. Monitors hardware items; and
8. Buffers experiment data.

Figure 29B:
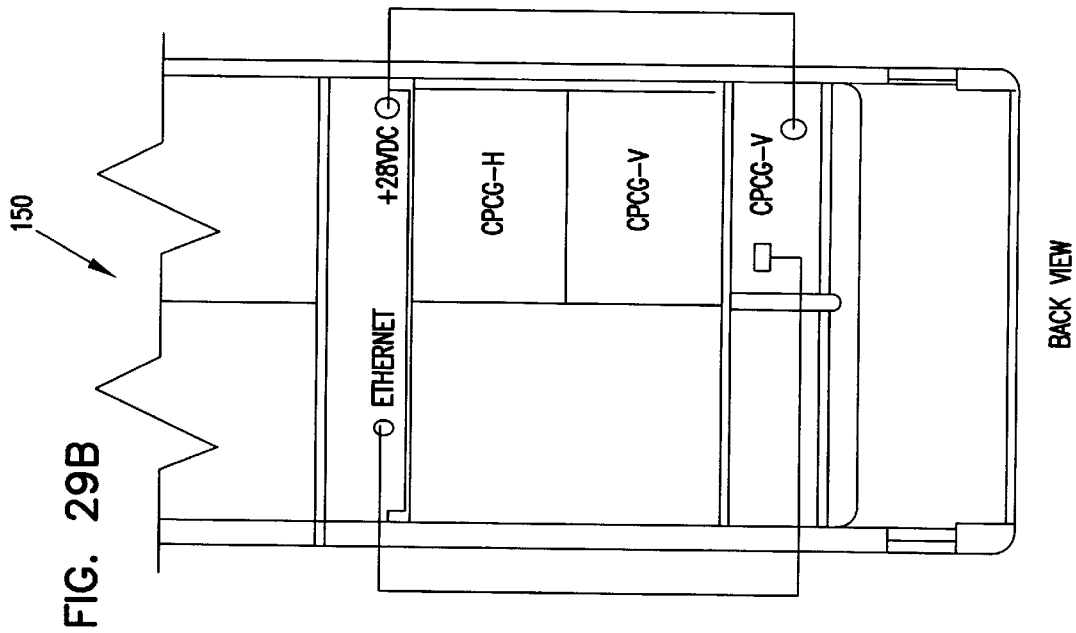
FIGS. 29A–B illustrate front and rear views, respectively, of one example of one embodiment of an express rack HDPCG/VCMS configuration.
Figure 29A:
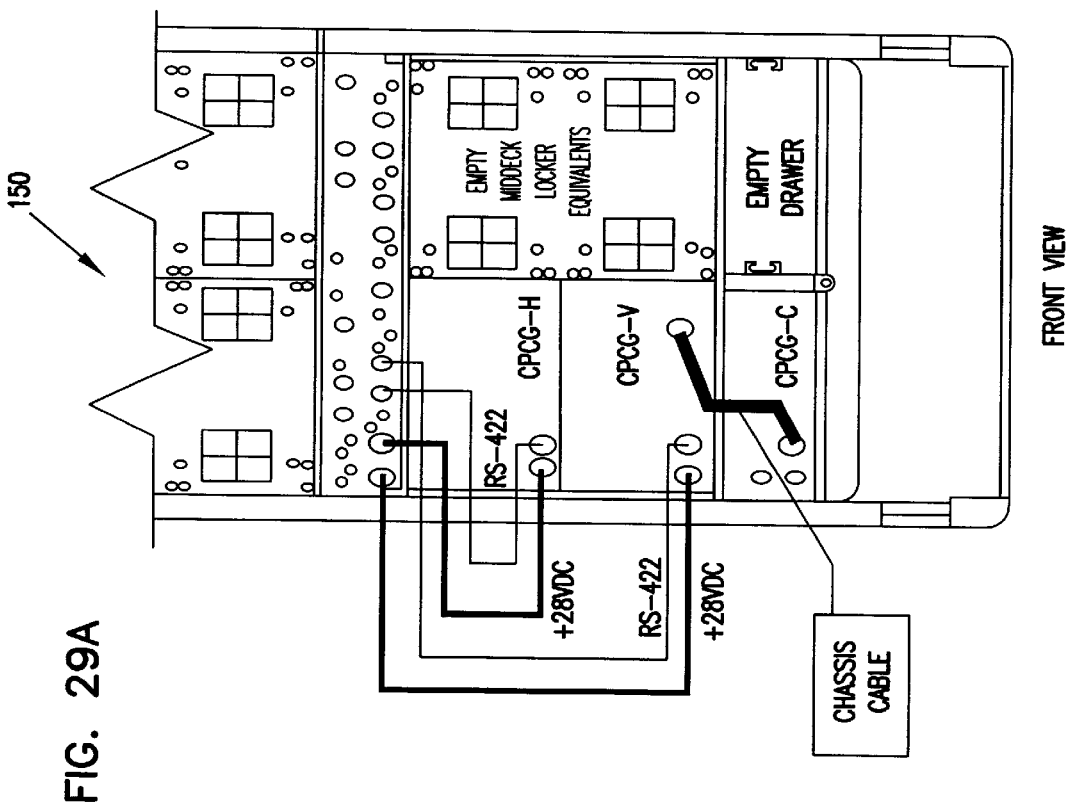

FIGS. 29A–B illustrate one embodiment of an express rack HDPCG/VCMS configuration. The HDPCG 250, VCMS chassis 61 and VCMS controller 107 experiment assemblies will utilize an EXPRESS Rack 150 (FIG. 29) in one Configuration. The thermal carriers for HDPCG and VCMS will utilize +28V power and RS422 communications on the rack front view (FIG. 29A). The cable from the VCMS controller 107 to the VCMS chassis 61 is illustrated in the front view of FIG. 29A. There are several connections located within the back of the EXPRESS rack 150. The ISIS drawer +28V power and Ethernet connections from the EXPRESS Rack 150 are routed as illustrated in the back view of FIG. 29B.

Figure 14:
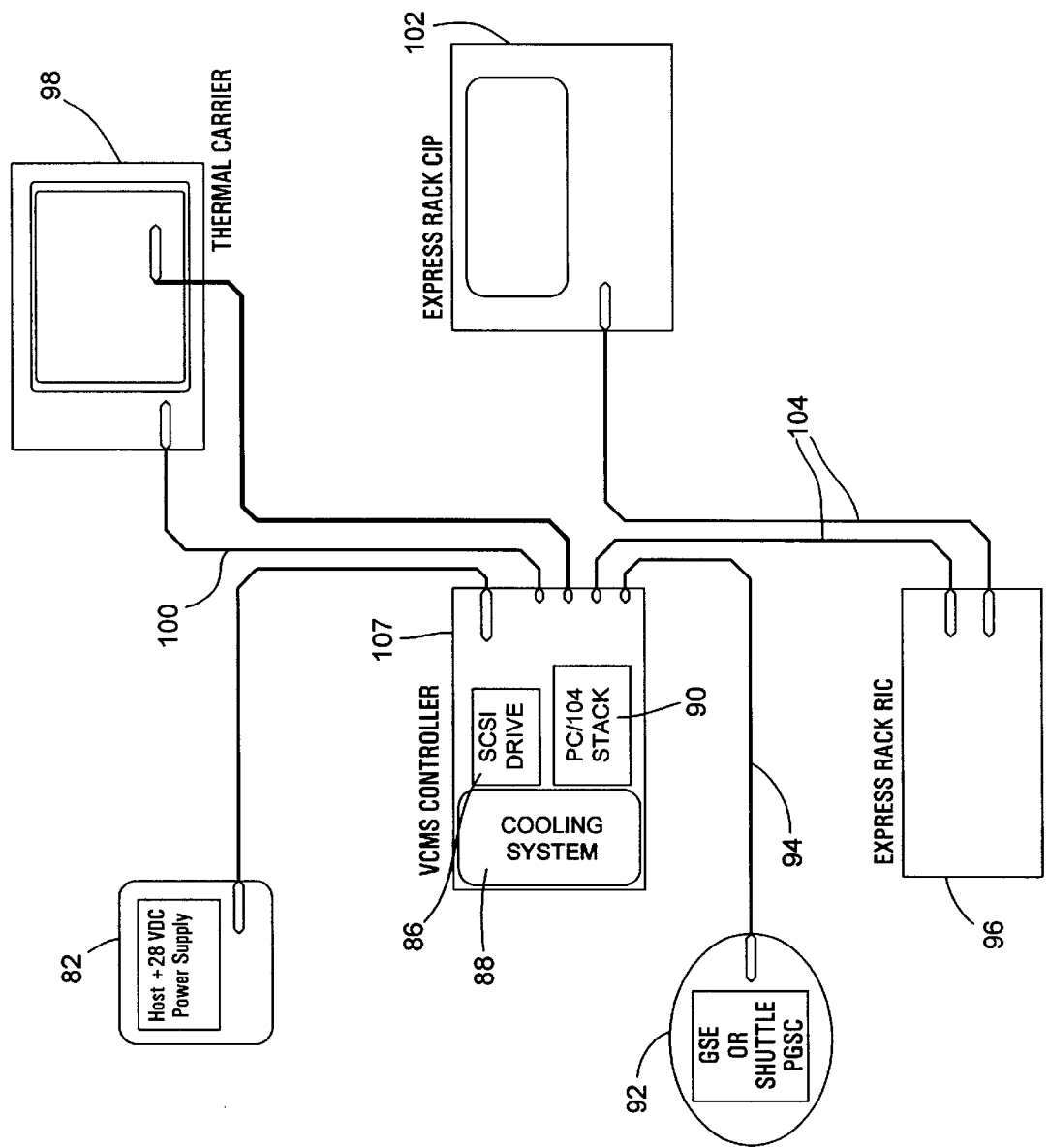
FIG. 14 illustrates a block diagram of one example of one embodiment of a video command and monitoring system (VCMS) controller.

FIG. 14 illustrates one embodiment of a block diagram of the VCMS controller 107 which contains the electronics for the system. The controller 107 may include five primary functions such as translation, illumination, video capture, disk storage and communications. It is located in an EXPRESS Rack ISIS drawer 147 where it is mounted to a modified base-plate. It utilizes the EXPRESS ISIS avionics air cooling loop to reject heat from the VCMS controller 107.

The HDPCG 43 and VCMS 61 experiment assemblies can utilize the EXPRESS Rack 150. The HDPCG 43 and VCMS 61 experiment assemblies utilize a host power supply 82 and the RS422 connections on the front of the rack. There is also a chassis connection to the VCMS 61 from the ISIS drawer and several connections that are located on the back of the rack. These are illustrated in FIGS. 29A–B. The ISIS drawer 147 utilizes a +28 V power source, Ethernet and analog (to SSPCM) connections from the EXPRESS rack.

The VCMS controller 107 is a self contained electronics box mounted in a 4 panel unit (PU) EXPRESS ISIS drawer 147. Heat is rejected via EXPRESS ISIS avionics air loop portion of the internal cooling loop 88. VCMS controller 84 further includes a small computer systems interface (SCSI) 86 drive for local electronic mass data storage and a stackable PC/104 expansion bus 90. The VCMS controller 107 communicates with peripheral devices via Ethernet communications on Ethernet bus 104 with the EXPRESS Rack interface controller 96 (RIC) and the EXPRESS Rack crew interface port (CIP) 102. The controller 107 interfaces with an RS422 communications interface 100 with thermal carrier. RS232 communications 94 is provided between the controller 84 and the GSE or Shuttle PGSC 92. It will be appreciated by those skilled in the art that the communications system may communicate digitized video images from a space station to a ground based station and form one ground based station to another ground based station.

The PC/104 bus 90 may be utilized for all computer boards such as Microprocessor (Ampro Computers, Inc.), Video Capture (Ajeco Oy, Inc.), Stepper Motor Controller (Technology 80, Inc.), Encoder Controller (Technology 80, Inc.), Stepper Motor Driver (UAB in-house design), DC—DC Converter (Tri-M Systems, Inc.) and Mass Storage (Seagate Technology, Inc.).

The microprocessor module (Ampro Littleboard 468I) includes an Intel 80486DX4 100 MHz CPU and 32 MB Dynamic Random Access Memory (DRAM). The microprocessor module is highly integrated and further includes four buffered serial ports, an Ethernet LAN interface and an SCSI-II bus interface. The microprocessor module also includes embedded features such as: bootable solid state disk support, watchdog timer and powerfail non-maskable interrupt (NMI), extended temperature operation, advanced power management functions and locking I/O connectors.

The video capture unit, Ajeco ANDI-FG, includes a Motorola 27 MHz DSP56001A digital signal processor, three 75 $\Omega$ software selectable video inputs, 640×525 digital resolution in NTSC, Y/C and composite video, eight bit A/D converter, 29.5 MHz sampling, JPEG format image upload and programming libraries in "C."

The Stepper Motor Controller may be a Tech 80 Model 5936, which includes three axes of intelligent control, directional velocity profiling, home, positive limit, and general purpose switch inputs and software-accessible functions that further include number of steps, low speed rate, high speed rate, acceleration/deceleration rate and amp-down point.

The Encoder Controller, a Tech 80 Model 5612, includes four incremental quadrature encoder inputs, three stage digital filter, software selectable filter clock 165.25 kHz to 10 MHz, 24-bit counter for each encoder and maskable PC/104 bus interrupt generation.

The Voltage Mode Stepper Motor Driver is PC/104 bus compatible and amplifies TTL level signals from the stepper controller 12 VDC output, motor direction and motor speed. The driver further controls the camera illumination LED on/off switching by LED fusing and LED current limiting.

The DC—DC converter, a Tri-M Systems HE104-512-TAC, includes up to 50W filtered power for VCMS electrical systems, PC/104 compatible design with active bus signal termination, load dump and transient noise suppression on input, logic level remote shutdown, +5 VDC@10A output, +12 VDC@2A output, 6–40 VDC input, <20 m Vpp ripple, <60 mV load regulation, <40 mV line regulation and up to 95% efficiency.

The mass storage unit, a Seagate Barracuda 9.1 Giga Byte model series that has been utilized in several NASA flights, includes 10 disks, 20 magneto resistive heads, 20 MB/sec maximum transfer rate, 512 kB multisegmented cache, 8.0/9.5 msec average seek, R/W, 4.17 msec average latency, 7,200 rpm spindle speed, 8-bit UltraSCSI interface, embedded servo control and has a 1,000,000 Mean Time Between Failure (MTBF).

One embodiment of a stepper motor 114 as illustrated in FIG. 20A is a MicroMo Stepping Gearmotor AM1524 that includes 24 steps per revolution>15 degree step angle, voltage mode motor, 12 VDC operation, 6 mNn (0.85 oz-in.) holding torque, 3.71:1 reduction gear (x-axis).

One embodiment of an encoder 135 as illustrated in FIG. 20B is a MicroMo Series HE that includes a magnetic mechanism, square wave output, TTL/CMOS output, 2 channels and 90 degree phase shift.

Nominal and reduced system power required by the system are illustrated in Table 1, as follows:

TABLE 1

| Device | Nominal Power, W | Reduced Power, W |
|---|---|---|
| LB 4861 CPU | 13 | 2.6 |
| ANDI-FG VIDEO CAPTURE | 2.55 | 1.2 |
| 5936 STEPPER CONTROLLER | 3.5 | 1.8 |
| 5912 ENCODER CONTROLLER | 0.005 | NA |
| TRANSLATION AMP. (ea.) | 0.348 | NA |
| HE104 DC/DC CONVERTER | 0.056 | NA |
| BARRACUDA HARD DRIVE | 12.4 | 4 |
| ENCODER (ea.) | 0.025 | NA |
| STEPPER MOTORS (ea.) | 0.174 | NA/OFF |
| CAMERA/LIGHTING CONTROL | 0.5 | NA |
| VIDEO CAMERA | 2.16 | NA/OFF |
| LIGHTING (ea.) | 0.125 | NA/OFF |
| TOTAL | 34.8 | 10.2 |

The VCMS controller 107 functions can be grouped into five distinct categories including translation, illumination, video capture, disk storage and communication. Each category enables varying levels of power management though software and hardware functions.

Figure 21:
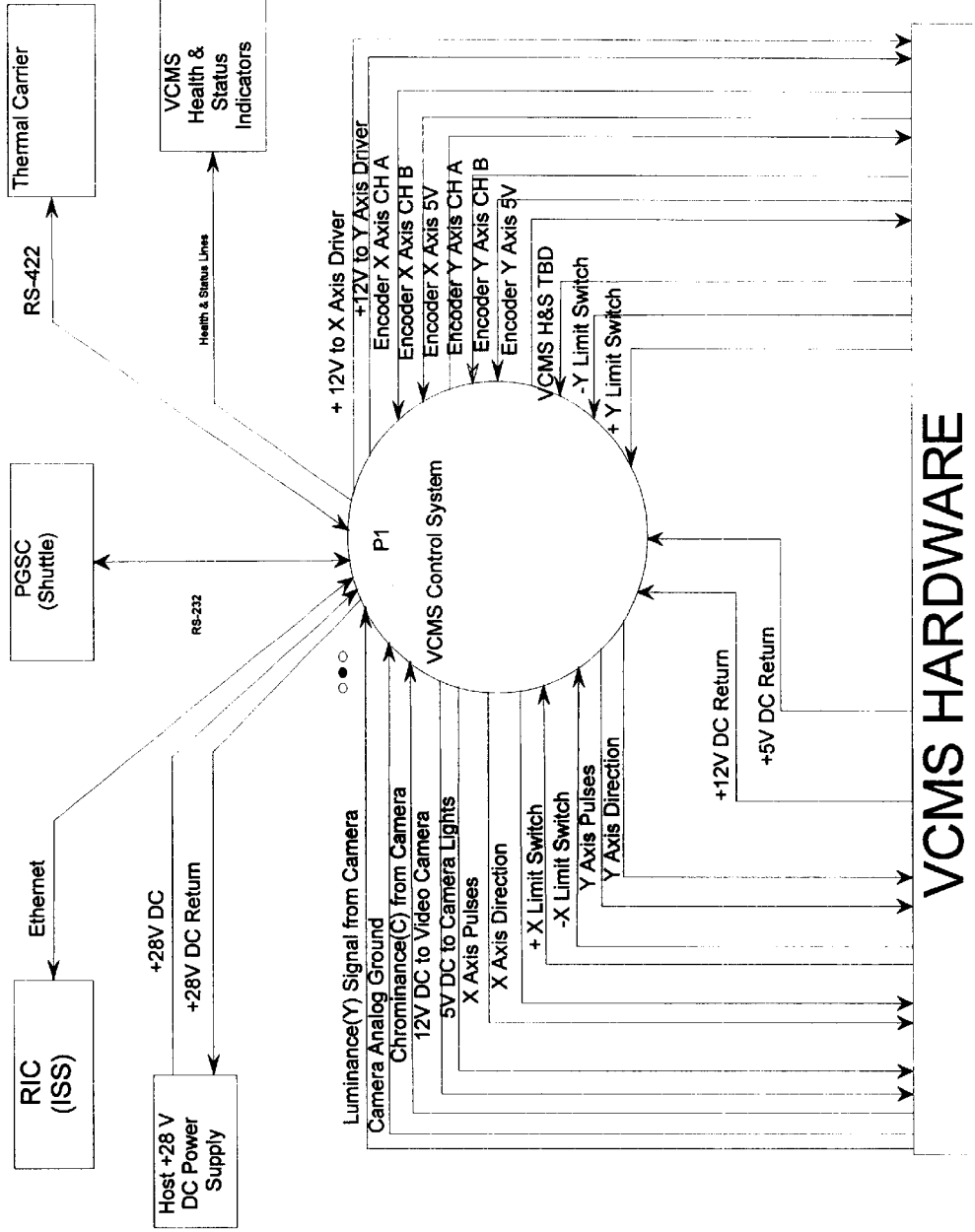
FIG. 21 illustrates one example context diagram of a VCMS.

FIG. 21 illustrates one embodiment of a VCMS context diagram.

Figure 22:
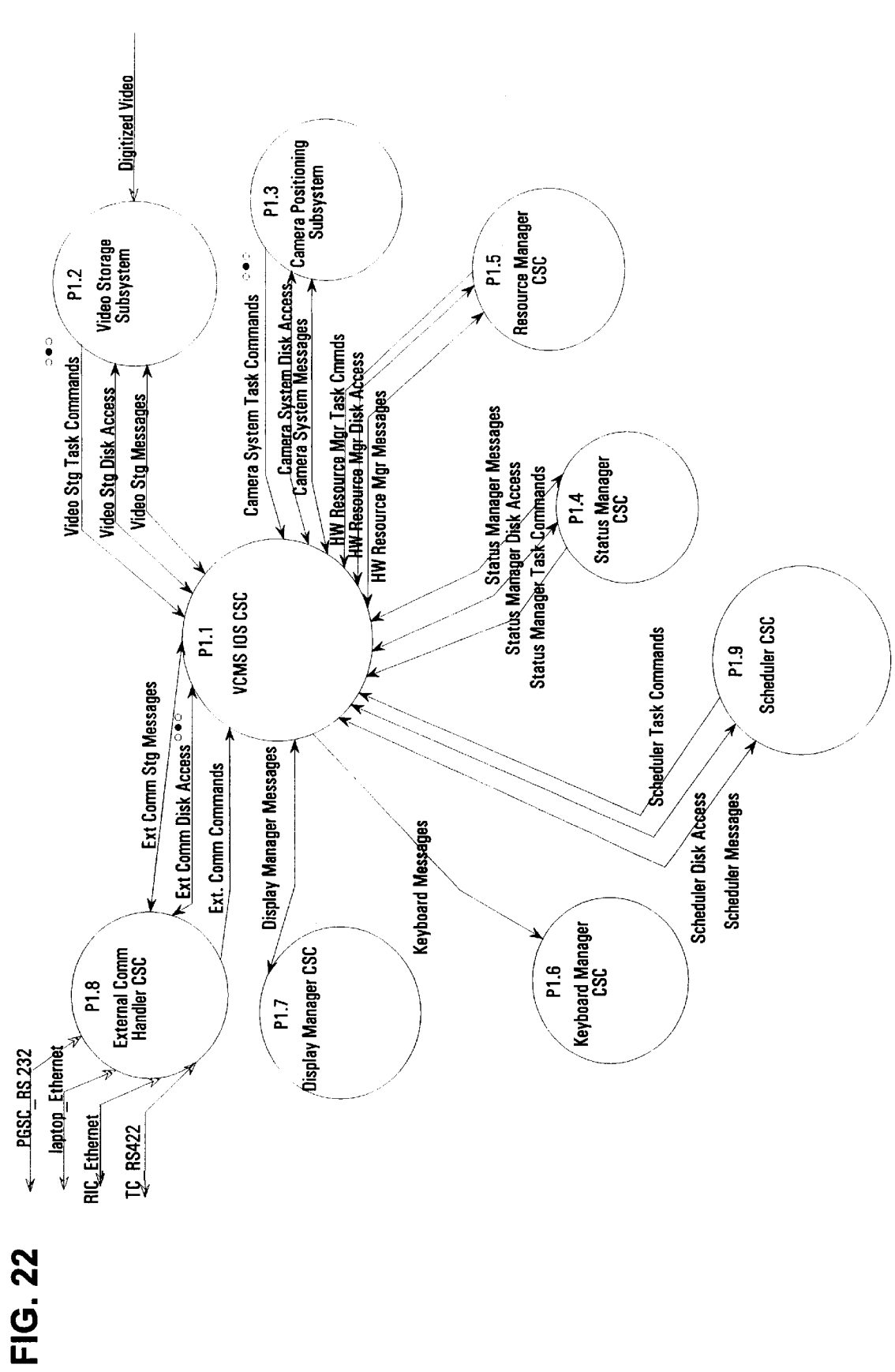
FIG. 22 illustrates one example of VCMS Input Output Subsystem (IOS) Computer Software Component (CSC) diagram.

FIG. 22 illustrates one embodiment of a VCMS IOS CSC diagram.

Figure 23:
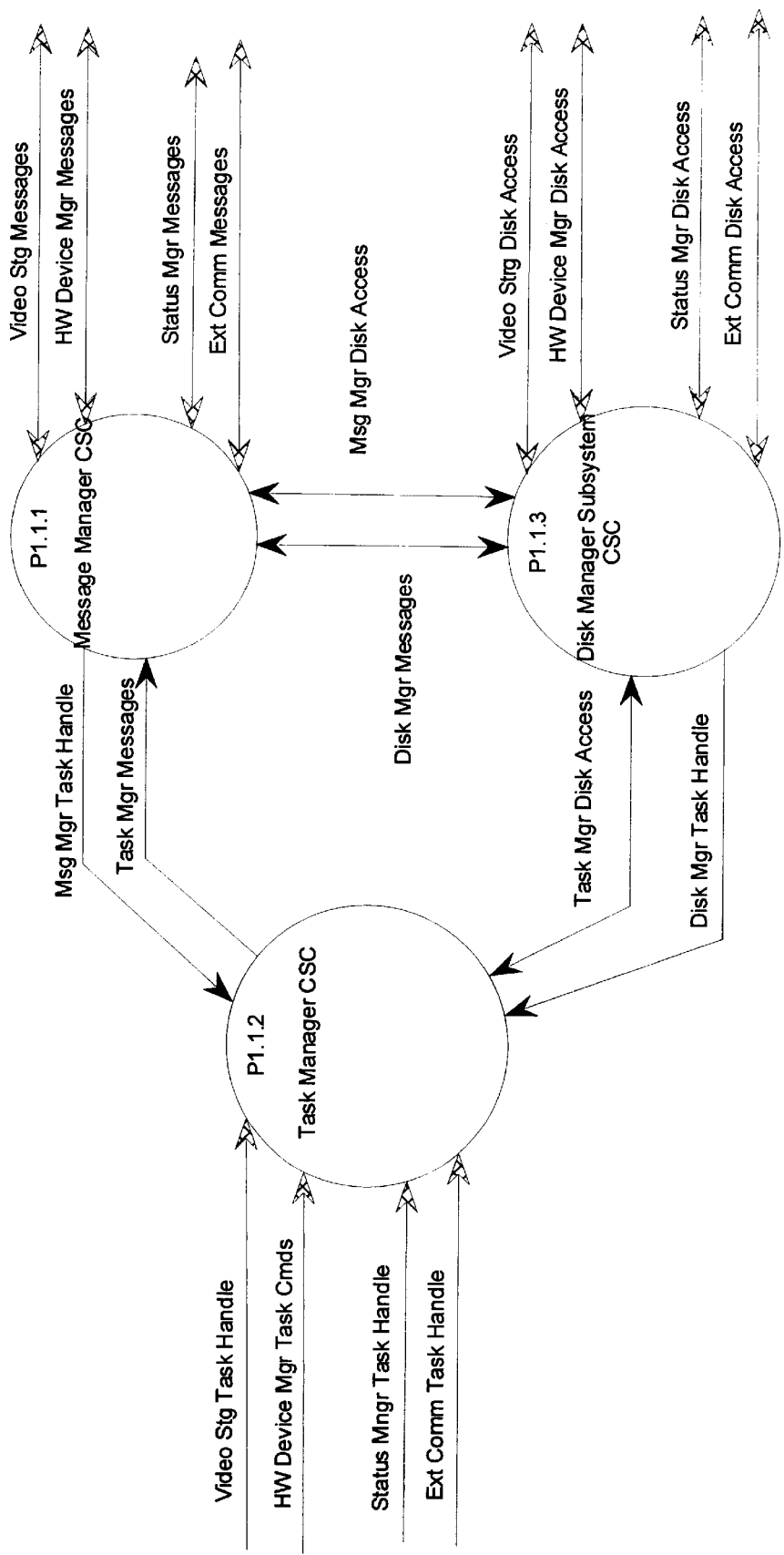
FIG. 23 illustrates one example of a VCMS IOS diagram.

FIG. 23 illustrates one embodiment of a VCMS IOS.

Figure 24:
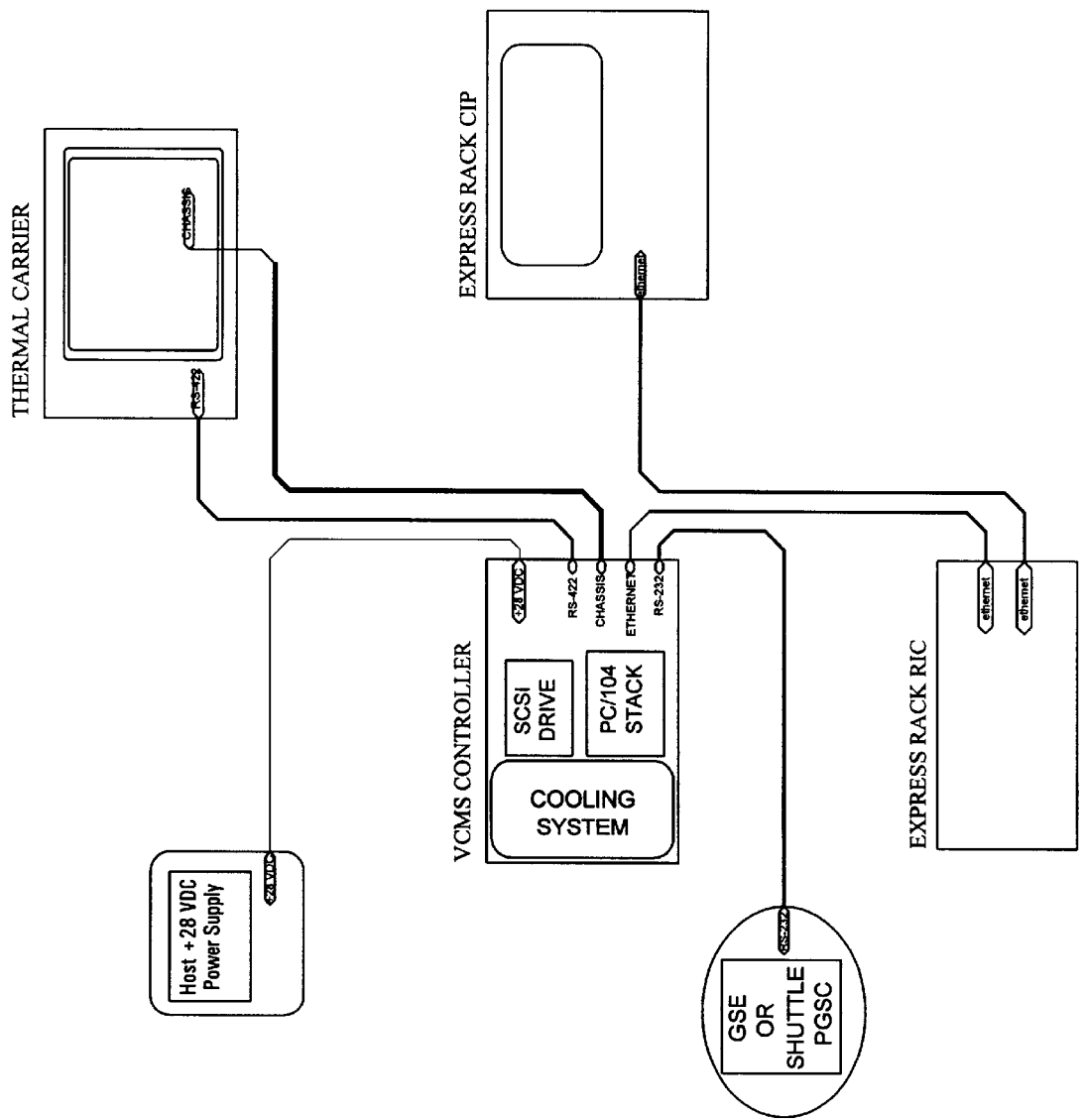
FIG. 24 illustrates a functional block diagram of one example of one embodiment of a VCMS controller.

FIG. 24 illustrates a block diagram of one embodiment of a VCMS controller.

Figure 25:
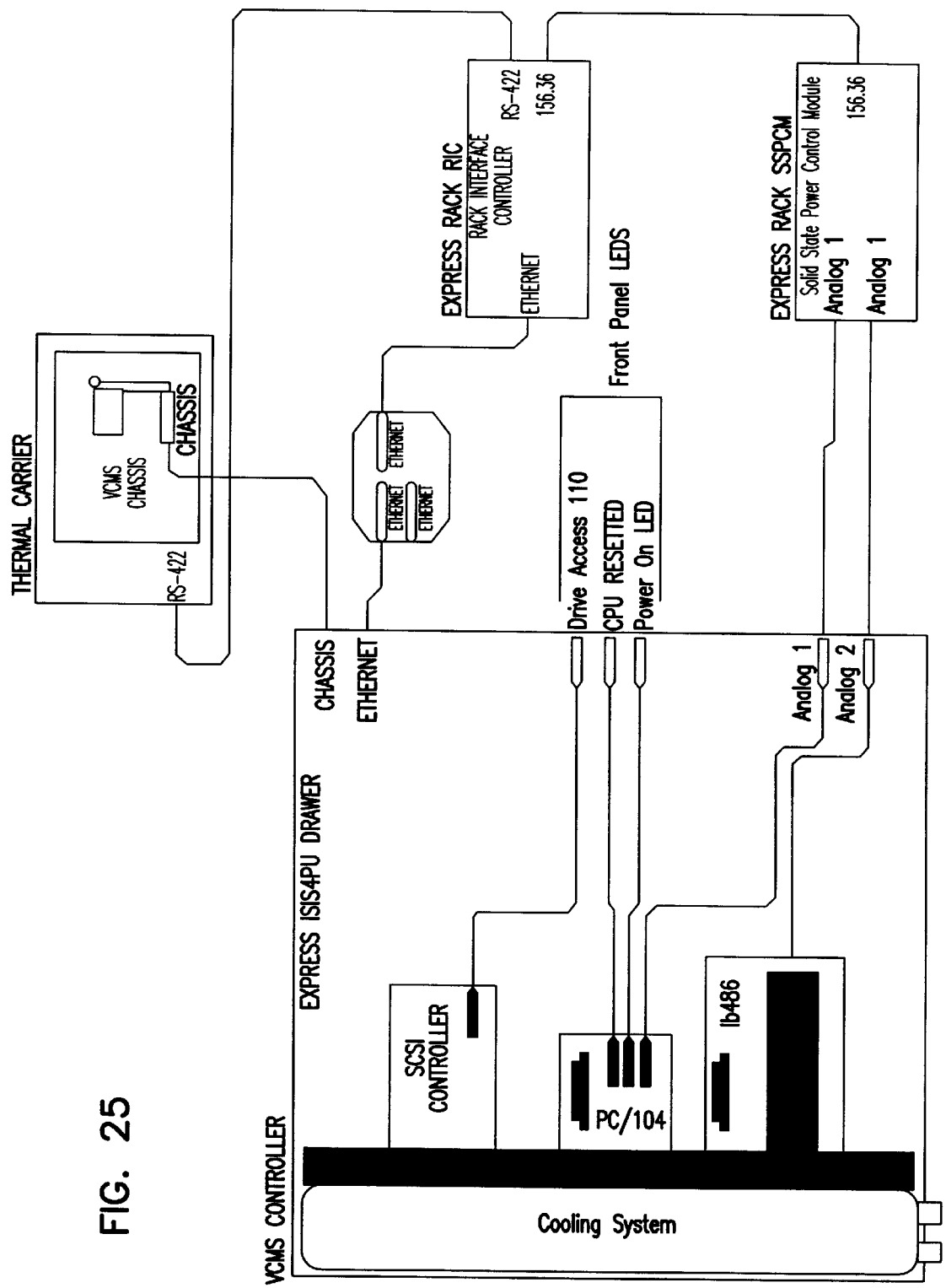
FIG. 25 illustrates a functional block diagram of one example of one embodiment of a VCMS controller.

FIG. 25 illustrates a block diagram of one embodiment of a VCMS controller.

Figure 26:
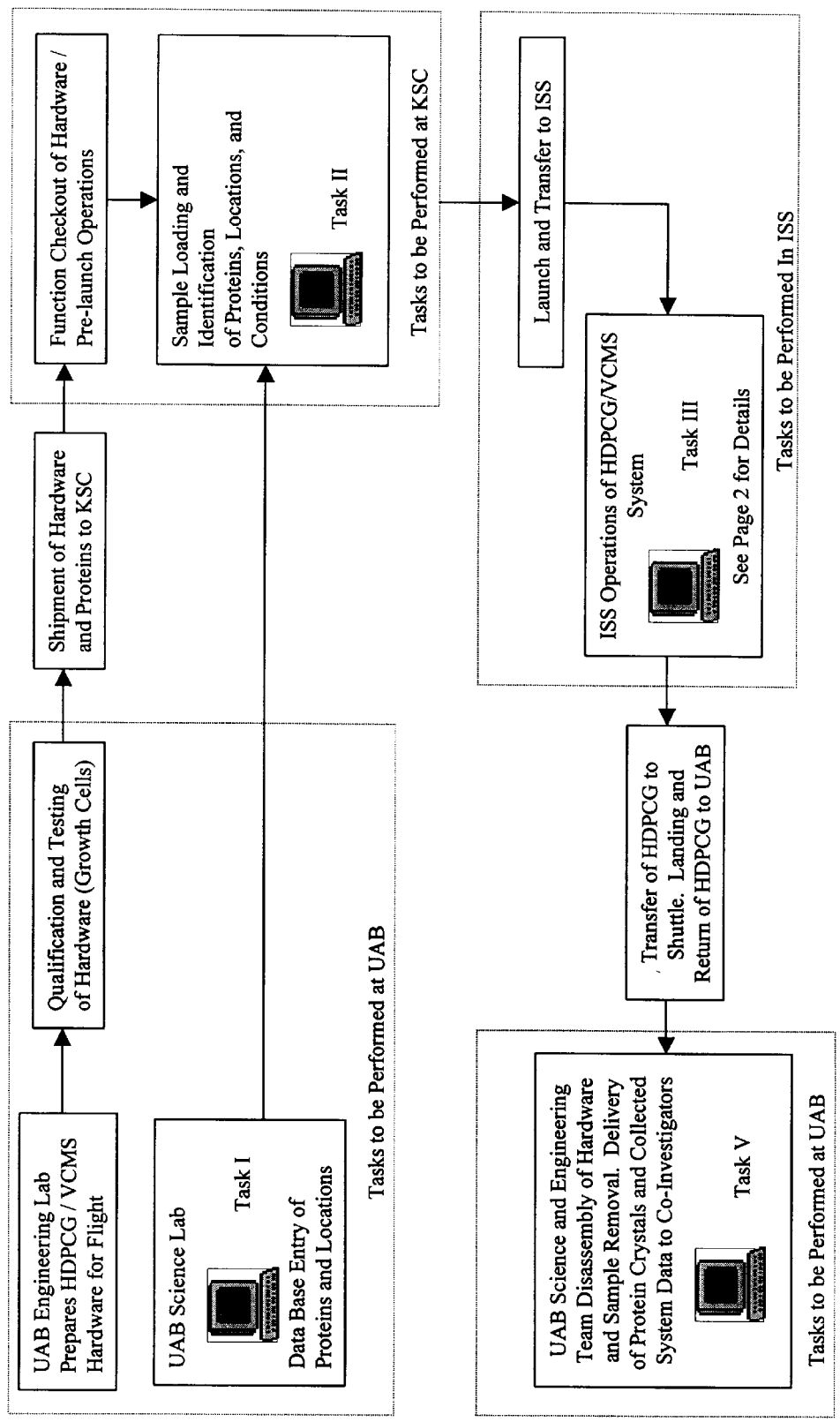
FIGS. 26 and 27 illustrate examples of flow diagrams of one embodiment of a HDPCG/VCMS operational scenario.
Figure 27:
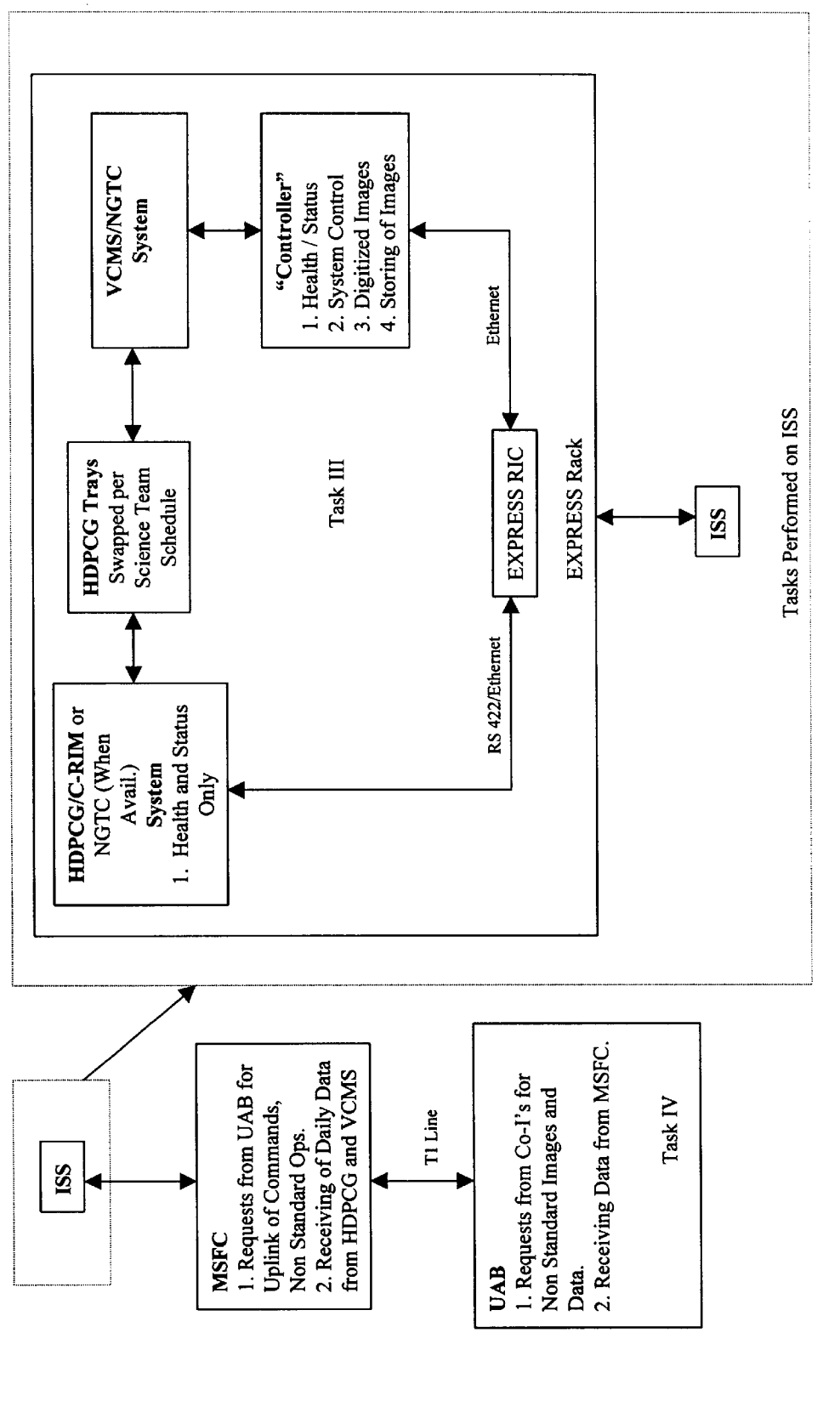

FIGS. 26 and 27 illustrate a flow diagram of one embodiment of a HDPCG/VCMS Operational Scenario.

The operational scenario is divided in five separate tasks follows:

Task I (Protein Candidate Database)

A database where protein candidates can be entered by the scientist. This database may include: protein name, co-investigator, number of samples, specifics such as volume size, growth rates and mission sequence and timeline.

Task II (Flight Protein Database)

The final flight configuration. When a growth cell block is completely full and ready to be placed into the tray, a bar code label is placed on the block. The bar code should reference a database which is generated above, but in addition includes: location of sample, actual percent concentrations and volumes loaded, time of loading, protein code written on cap of cell, and comment lines.

Task III (Command and Control of VCMS)

The VCMS will perform the following operations while on ISS: Automatically scan all the viewable cells on a given tray twice daily and take a "snap shot"; store the digitized "snap shot" until it can be downlinked; place the images into a name specific file that can be interpreted on the ground as being a specific protein, and store the image with the file generated with Task I; move to a particular position and take a "snap shot" when given a command from the ground or by a crew member; capture the image and compress it using the best compression algorithms available possible with the given hardware; transfer health and status data from the NGTC to the EXPRESS Rack and eventually attach temperature data with the images for the database; and encryption of images before placing into the packet of data to be down-linked.

Task IV (Ground Based Operations)

The ground based system will have to do the following: receive the data packet, for example from the Marshall Space Flight Center (MSFC) and direct the images to their particular file; manage the large amount of data that will be received and place it on some type of media for transfer back to the Co-Investigators; and send requests to the MSFC (off nominal operations).

Task V (Post Flight Evaluations)

The post flight database will include information taken from the previous tasks and include: temperature data of the entire mission; digitized post flight analysis images, flight duration time; and comments during analysis.

Figure 28:
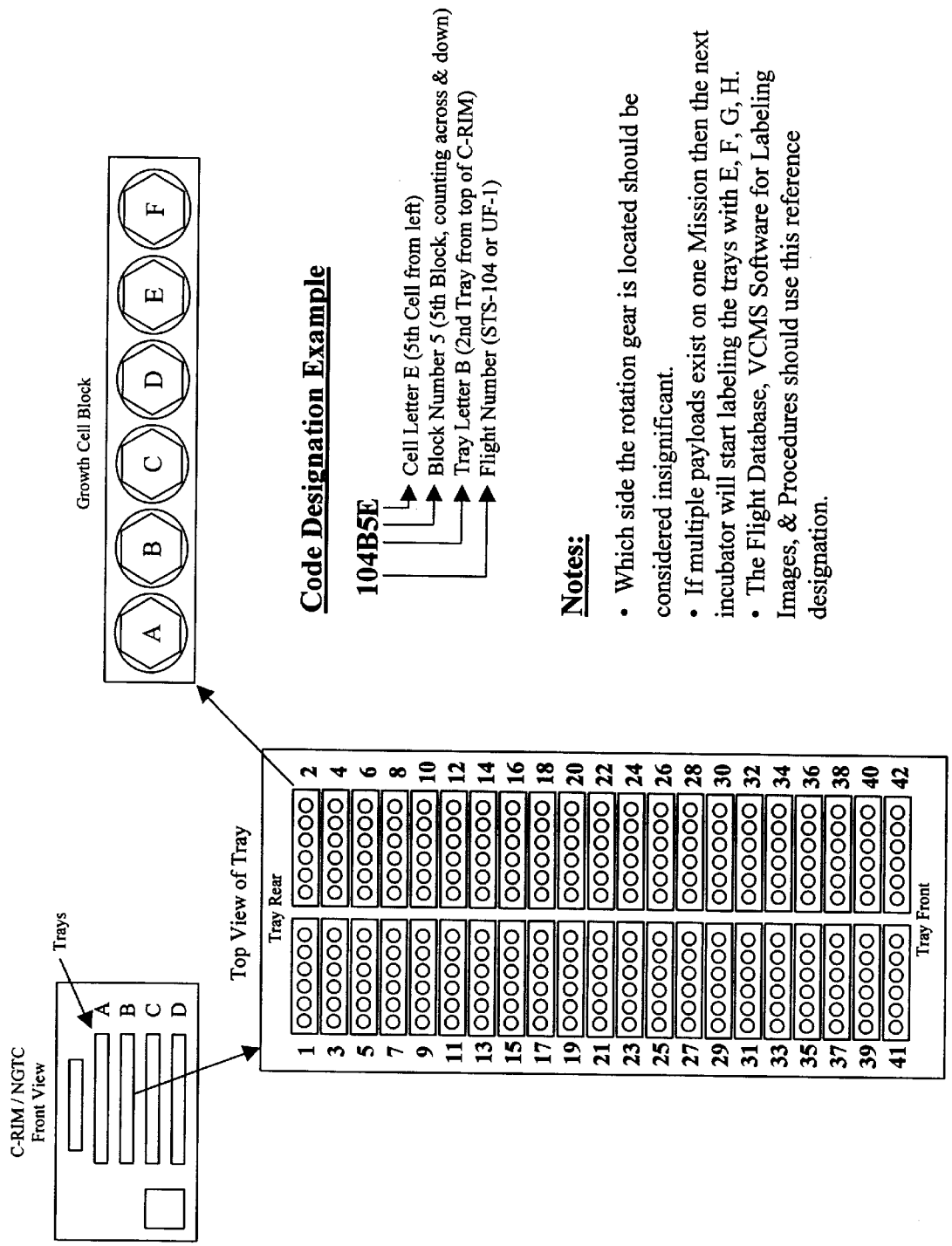
FIG. 28 illustrates one example of one embodiment of a code designation system.

FIG. 28 illustrates one embodiment of a code designation system.

The foregoing description of the specific embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this description, but rather by the claims appended hereto.

The claimed invention is:

1. A protein crystal growth incubator assembly, comprising:
   a housing having interior and exterior sides defining an internal storage compartment;
   a stacked protein crystal growth tray configuration slideable into and out of the internal storage compartment, said stacked protein crystal growth tray configuration holding one or more protein crystal growth tray assemblies;
   a retainer door assembly disposed on a front end of said housing where said stacked protein crystal growth tray configuration is slid into and out of said internal storage compartment;
   insulation disposed adjacent to said retainer door assembly; and
   a door disposed adjacent to said insulation.

2. A protein crystal growth incubator assembly according to claim 1, wherein each of said protein crystal growth assemblies comprises:
   a crystal growth cell comprising,
      a cell body having a top side and a bottom side and a first aperture defined therethrough, said cell body having opposed first and second sides and a second aperture defined therethrough;
      a cell barrel disposed within said cell body, said cell barrel defining a cavity alignable with the first aperture of said cell body, said cell barrel being rotatable within the second aperture;
      a reservoir coupled to the bottom side of said cell body; and
      a cap having a top side disposed on the top side of said cell body.

3. A protein crystal growth incubator assembly according to claim 1, further comprising slides provided within said internal storage compartment, said slides providing support surfaces for sliding said stacked protein crystal tray configuration into and out of the internal storage compartment.

4. A protein crystal growth incubator assembly according to claim 1, further comprising:
a control interface disposed on an exterior side of said housing, for setting experimental parameters of experiments contained within the protein crystal growth incubator assembly.

5. A protein crystal growth incubator assembly according to claim 1, wherein one or more slots are provided in said retainer door assembly.

6. A protein crystal growth incubator assembly according to claim 5, wherein said one or more slots are aligned with a protein crystal growth tray assembly activation/deactivation mechanism disposed on the protein crystal growth assembly.

7. A protein crystal growth incubator assembly according to claim 6, wherein said one or more slots are arranged to allow activation/deactivation of one or more protein crystal growth tray assemblies individually.

8. A protein crystal growth incubator assembly according to claim 1, wherein said stacked protein crystal growth tray configuration further comprises:
first and second side walls disposed opposite from each other;
a rear stop disposed at a rear portion of said stacked protein crystal tray configuration; and
an internal structure assembly for holding one or more of the protein crystal growth tray assemblies.

9. A protein crystal growth incubator assembly according to claim 8, wherein said stacked protein crystal growth tray configuration comprises four protein crystal growth tray assemblies.

10. A protein crystal growth incubator assembly according to claim 9, wherein each one of the four protein crystal growth tray assemblies comprises forty two protein crystal growth assemblies disposed therein.

11. A protein crystal growth incubator assembly according to claim 10 wherein each protein crystal growth tray assembly including the forty two protein crystal growth assemblies weighs no more than about 6 lbs.

12. A protein crystal growth incubator assembly according to claim 9, wherein said protein crystal growth assemblies comprise:
a crystal growth cell comprising,
a cell body having a top side and a bottom side and a first aperture defined therethrough, said cell body having opposed first and second sides and a second aperture defined therethrough;
a cell barrel disposed within said cell body, said cell barrel defining a cavity alignable with the first aperture of said cell body, said cell barrel being rotatable within the second aperture;
a reservoir coupled to the bottom side of said cell body; and
a cap having a top side disposed on the top side of said cell body.

13. A protein crystal growth incubator assembly according to claim 8, wherein said stacked protein crystal growth tray configuration comprises one thousand eight protein crystal growth cells.

14. A protein crystal growth incubator assembly according to claim 8, wherein an internal storage compartment of said protein crystal growth incubator assembly has a width of about 10 inches, a height of about 7 inches and a depth of about 17 inches.

15. A protein crystal growth incubator assembly, comprising:
a housing having interior and exterior sides defining an internal storage compartment; and a stacked protein crystal growth tray configuration slideable into and out of the internal storage compartment, said stacked protein crystal growth tray configuration holding one or more protein crystal growth tray assemblies, wherein said stacked protein crystal growth tray configuration further comprises:
first and second side walls disposed opposite from each other;
a rear stop disposed at a rear portion of said stacked protein crystal tray configuration; and
an internal structure assembly for holding one or more of the protein crystal growth tray assemblies.

16. A protein crystal growth incubator assembly according to claim 15, wherein said stacked protein crystal growth tray configuration comprises four protein crystal growth tray assemblies.

17. A protein crystal growth incubator assembly according to claim 16, wherein each one of the four protein crystal growth tray assemblies comprises forty two protein crystal growth assemblies disposed therein.

18. A protein crystal growth incubator assembly according to claim 17, wherein each protein crystal growth tray assembly including the forty two protein crystal growth assemblies weighs no more than about 6 lbs.

19. A protein crystal growth incubator assembly according to claim 15, wherein said protein crystal growth assemblies comprise:
a crystal growth cell comprising,
a cell body having a top side and a bottom side and a first aperture defined therethrough, said cell body having opposed first and second sides and a second aperture defined therethrough;
a cell barrel disposed within said cell body, said cell barrel defining a cavity alignable with the first aperture of said cell body, said cell barrel being rotatable within the second aperture;
a reservoir coupled to the bottom side of said cell body; and
a cap having a top side disposed on the top side of said cell body.

20. A protein crystal growth incubator assembly according to claim 15, wherein said stacked protein crystal growth tray configuration comprises one thousand eight protein crystal growth cells.

21. A protein crystal growth incubator assembly according to claim 15, wherein the internal storage compartment of said protein crystal growth incubator assembly has a width of about 10 inches, a height of about 7 inches and a depth of about 17 inches.

* * * * *